(12) United States Patent
Mihara

(10) Patent No.: US 6,281,716 B1
(45) Date of Patent: *Aug. 28, 2001

(54) POTENTIAL DETECT CIRCUIT FOR DETECTING WHETHER OUTPUT POTENTIAL OF POTENTIAL GENERATION CIRCUIT HAS ARRIVED AT TARGET POTENTIAL OR NOT

(75) Inventor: Masaaki Mihara, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/195,454

(22) Filed: Nov. 18, 1998

(30) Foreign Application Priority Data

Jul. 1, 1998 (JP) .................................................. 10-186147

(51) Int. Cl.$^7$ .................................................. H03K 5/153
(52) U.S. Cl. .................................. 327/80; 327/81; 327/143
(58) Field of Search .................................. 327/77, 80, 81, 327/88, 89, 143, 198, 537, 535, 541, 543

(56) References Cited

U.S. PATENT DOCUMENTS

| | | | |
|---|---|---|---|
| 4,309,627 | * | 1/1982 | Tabata ..................... 327/81 |
| 5,166,549 | * | 11/1992 | DeDoncker ..................... 327/78 |
| 5,378,936 | * | 1/1995 | Kokubo et al. ..................... 327/77 |
| 5,677,643 | * | 10/1997 | Tomita ..................... 327/89 |
| 5,760,614 | * | 6/1998 | Ooishi et al. ..................... 327/81 |
| 5,847,597 | | 12/1998 | Ooishi et al. ..................... 327/543 |
| 5,942,921 | * | 8/1999 | Talaga, Jr. ..................... 327/77 |
| 6,008,674 | * | 12/1999 | Wada et al. ..................... 327/89 |

FOREIGN PATENT DOCUMENTS

| | | | |
|---|---|---|---|
| 03261871 | 11/1991 | (JP) | ............... G01R/19/00 |
| 95-25774 | 9/1995 | (KR) | ............... G11C/5/14 |

OTHER PUBLICATIONS

Korean Notice of Ground of Rejection dated Nov. 28, 2000 with English translation.

* cited by examiner

Primary Examiner—Toan Tran
(74) Attorney, Agent, or Firm—McDermott, Will & Emery

(57) ABSTRACT

A resistance element and an N channel MOS transistor are connected in series between an output terminal of a voltage generation circuit in a flash memory and a line of a ground potential. A constant current is conducted to the MOS transistor, and the potential of the drain of the N channel MOS transistor is compared with a reference potential by a comparator. The voltage conversion factor becomes 1, so that the voltage detection accuracy is improved.

14 Claims, 20 Drawing Sheets

WRITE

ERASURE

FIG.4
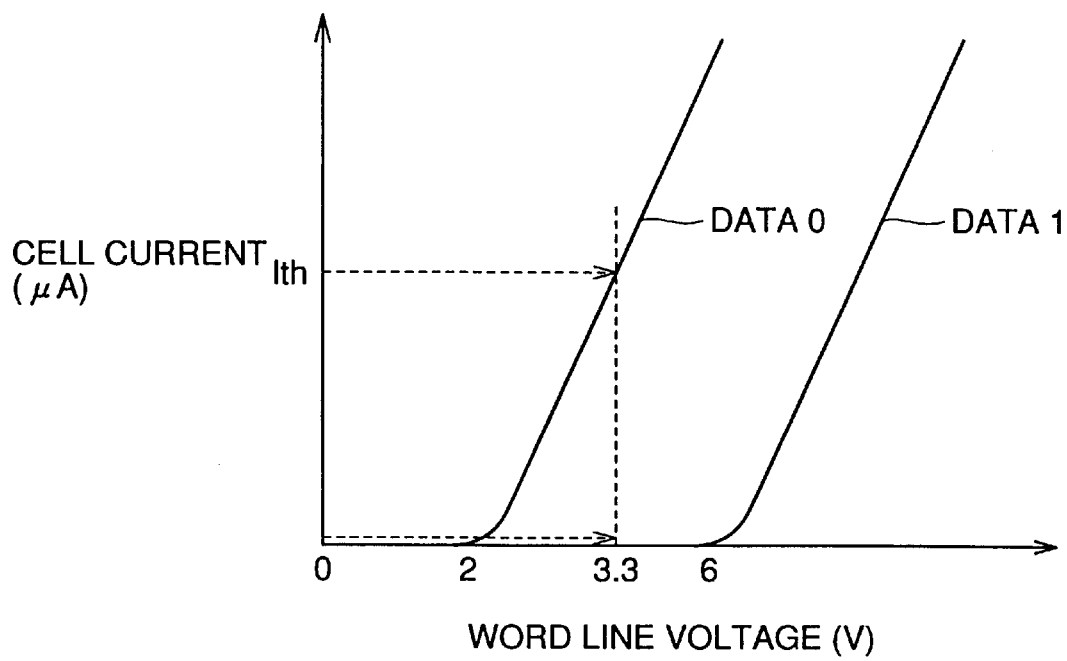
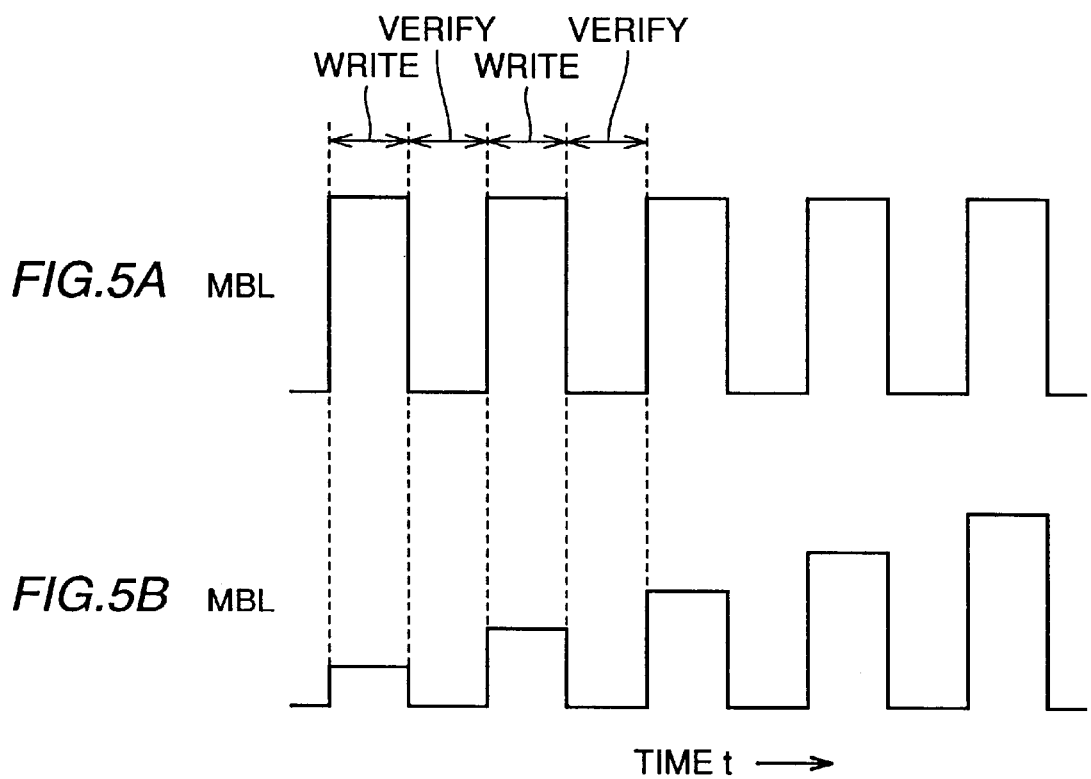

US 6,281,716 B1

POTENTIAL DETECT CIRCUIT FOR DETECTING WHETHER OUTPUT POTENTIAL OF POTENTIAL GENERATION CIRCUIT HAS ARRIVED AT TARGET POTENTIAL OR NOT

BACKGROUND OF THE INVENTION

1. Field of the Invention

The present invention relates to potential detect circuits, and more particularly, to a potential detect circuit for detecting whether the potential at the output node of a potential generation circuit has arrived at a predetermined target potential level or not.

2. Description of the Background Art

In a flash memory, data "0" or "1" is stored in a memory cell by drawing out or injecting charge from/to a floating gate of the memory cell (refer to FIG. 3). High voltage is required in drawing out or injecting the charge. The level of the high voltage must be set accurately in order to exactly control the amount of charge drawn out or injected with respect to the floating gate of the memory cell.

This high voltage is generated by a high voltage generation circuit (for example, a charge pump circuit) in the device. However, the voltage generated by the high voltage generation circuit is altered in accordance with the operating condition of the circuit (for example, the power supply voltage level and temperature). The operation of the high voltage generation circuit had to be controlled using a circuit that detects the high voltage.

FIG. 23 is a circuit diagram showing a structure of a conventional high voltage detect circuit. Referring to FIG. 23, this high voltage detect circuit includes two resistance elements 101 and 102 connected in series between an output terminal 100 of the high voltage generation circuit and the line of ground potential GND, a comparator 103 formed of P channel MOS transistors 104 and 105 and N channel MOS transistors 106 and 107, and an inverter 108. Resistance elements 101 and 102 form a voltage divider circuit. When the potential of output terminal 100 of the high voltage generation circuit is VP and the resistance values of resistance elements 101 and 102 are R5 and R6, respectively, the potential VO of a node N101 between resistance elements 101 and 102 is VO=VP·R6/(R5+R6).

MOS transistors 104 and 106 and MOS transistors 105 and 107 are connected in series between respective lines of power supply potential VCC and ground potential GND. P channel MOS transistors 104 and 105 have their gates both connected to the drain of P channel MOS transistor 104. P channel MOS transistors 104 and 105 form a current mirror circuit. N channel MOS transistors 106 and 107 receive potential VO and reference potential Vr5 at their gates, respectively. The drain of P channel MOS transistor 105 is the output node 103a of comparator 103. The output signal of comparator 103 is inverted by inverter 108 to become a high voltage detect signal /DE.

When potential VP is lower than the target potential and VO is lower than Vr5, the resistance value of N channel MOS transistor 106 becomes greater than the resistance value of N channel MOS transistor 107, whereby node 103a is pulled down to an L level to drive signal /DE to an H level. When potential VP exceeds the target potential and VO becomes higher than Vr5, the resistance value of N channel MOS transistor 106 becomes smaller than the resistance value of N channel MOS transistor 107, whereby node 103a is pulled up to an H level to drive signal /DE to an L level.

The high voltage generation circuit is rendered active and inactive in response to signal /DE of an H level and an L level, respectively. Accordingly, the potential of output terminal 100 is maintained at the target potential.

FIG. 24 is a circuit block diagram showing a structure of another conventional high voltage detect circuit. The high voltage detect circuit of FIG. 24 differs from the high voltage detect circuit of FIG. 23 in that resistance element 101 is substituted with a variable resistance circuit 110.

Referring to FIG. 24, variable resistance circuit 110 includes a plurality (three in the drawing) of resistance elements 101a–10c connected in series between output terminal 100 and node N101, and P channel MOS transistors 111a–111c connected in parallel to resistance elements 101a–101c, respectively. P channel MOS transistors 111a–111c have their gates connected to a control circuit 112.

The conductive resistances of P channel MOS transistors 111a–111c are smaller than resistance values R5a–R5c of resistance elements 101a–101c. By rendering conductive a desired one of P channel MOS transistors 111a–111c by control circuit 112, resistance value R5 of variable resistance circuit 110 can be modified. Since VO/VP becomes smaller as resistance value R5 becomes greater, VP can be increased by matching VO with Vr5. In contrast, VO/VP becomes greater as resistance value R5 is reduced, so that VP can be set smaller by matching VO with Vr5. Therefore, by using this high voltage detect circuit and one charge pump, the level of the high voltage can be switched in response to change in resistance value R5 of variable resistance circuit 110.

In the above-described conventional high voltage detect circuit, the voltage conversion factor $\Delta VO/\Delta VP$ becomes $\Delta VO/\Delta VP=R6/(R5+R6)$. Since $R6/(R5+R6)<1$, the voltage conversion factor becomes lower. A lower voltage conversion factor degrades the detection accuracy of the high voltage detect circuit, which in turn reduces the setting accuracy of the level of the high voltage.

SUMMARY OF THE INVENTION

In view of the foregoing, an object of the present invention is to provide a potential detect circuit of high potential detect accuracy.

According to an aspect of the present invention, a voltage detect circuit includes a first resistance element and a constant current circuit connected in series between the output node of a voltage generation circuit and the line of a first reference potential. A second reference potential which is the target potential shifted to the first reference potential side by the voltage generated across the electrodes of the first resistance element is compared with the potential at the node between the first resistance element and the constant current circuit. Therefore, the potential conversion factor becomes 1 to improve the detection accuracy.

Preferably, the current of the constant current circuit is variable. In this case, the target potential can be modified by maintaining the second reference potential constant.

Also preferably, the constant current circuit includes a first transistor and a second resistance element connected in series between the lines of first and second power supply potentials, a control circuit controlling the input voltage of the first transistor so that the potential across the first transistor and the second resistance element matches a third reference potential, and a second transistor connected in series with the first resistance element to conduct a current according to the first transistor. Accordingly, a constant current circuit can be easily implemented.

Also preferably, the resistance value of the second resistance element is variable. In this case, the current of the constant current circuit can be modified by changing the resistance value of the second resistance element.

Also preferably, the current ratio of the first transistor to the second transistor is variable. In this case, the current of the constant current circuit can be modified by changing the current ratio of the first and second transistors.

Also preferably, the resistance value of the first resistance element is variable. In this case, the target potential can be modified by maintaining the first reference potential constant.

Also preferably, the first resistance element is divided into a plurality of third resistance elements connected in series. The second transistor is provided corresponding to each third resistance element, and has a first electrode electrically coupled to the potential of the constant current circuit side of the third resistance element. The potential detect circuit further includes a select circuit for selecting any of the plurality of second transistors, and a connect circuit for connecting the second electrode of the second transistor selected by the select circuit to the line of the first reference potential. In this case, the resistance value of the first resistance element can be modified by selecting any of the plurality of second transistors.

Further preferably, the potential detect circuit further includes a voltage apply circuit for applying a predetermined input voltage to the second transistor that was not selected by the select circuit to render the second transistor nonconductive. In this case, unnecessary current is prevented from flowing through the second transistor that was not selected.

Also preferably, the potential generation circuit is a chart pump circuit. In this case, the output potential of the charge pump circuit can be detected accurately.

Also preferably, the potential generation circuit and the potential detect circuit are provided in a semiconductor memory device. In this case, the output potential of the potential generation circuit in the semiconductor memory device can be detected accurately to allow accurate control of the output potential of the potential generation circuit according to the detected result.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram for describing the operation of the memory cell of FIGS. 3A and 3B.

FIGS. 5A and 5B are timing charts for describing the method of writing data into the memory cell of FIGS. 3A and 3B.

DESCRIPTION OF THE PREFERRED EMBODIMENTS

First Embodiment

Figure 1:
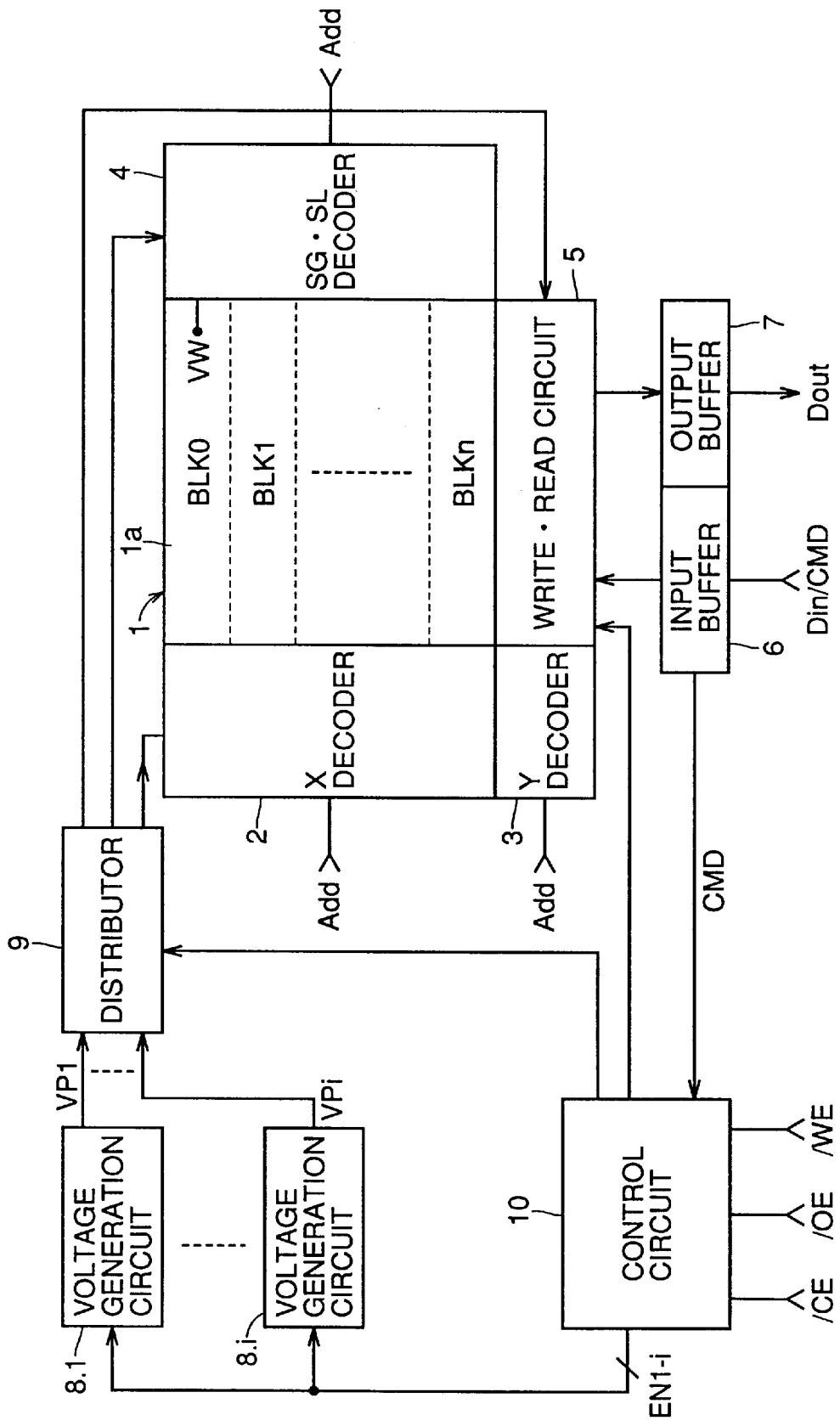
FIG. 1 is a block diagram showing a structure of a flash memory according to a first embodiment of the present invention.

FIG. 1 is a block diagram of a structure of a flash memory with a portion not shown according to a first embodiment of the present invention.

Referring to FIG. 1, the flash memory includes a memory array 1, an X decoder 2, a Y decoder 3, a SG·Sl decoder 4, a write read circuit 5, an input buffer 6, an output buffer 7, a plurality of voltage generation circuits 8.1–8.i (where i is an integer of at least 2), a distributor 9, and a control circuit 10.

Figure 2:
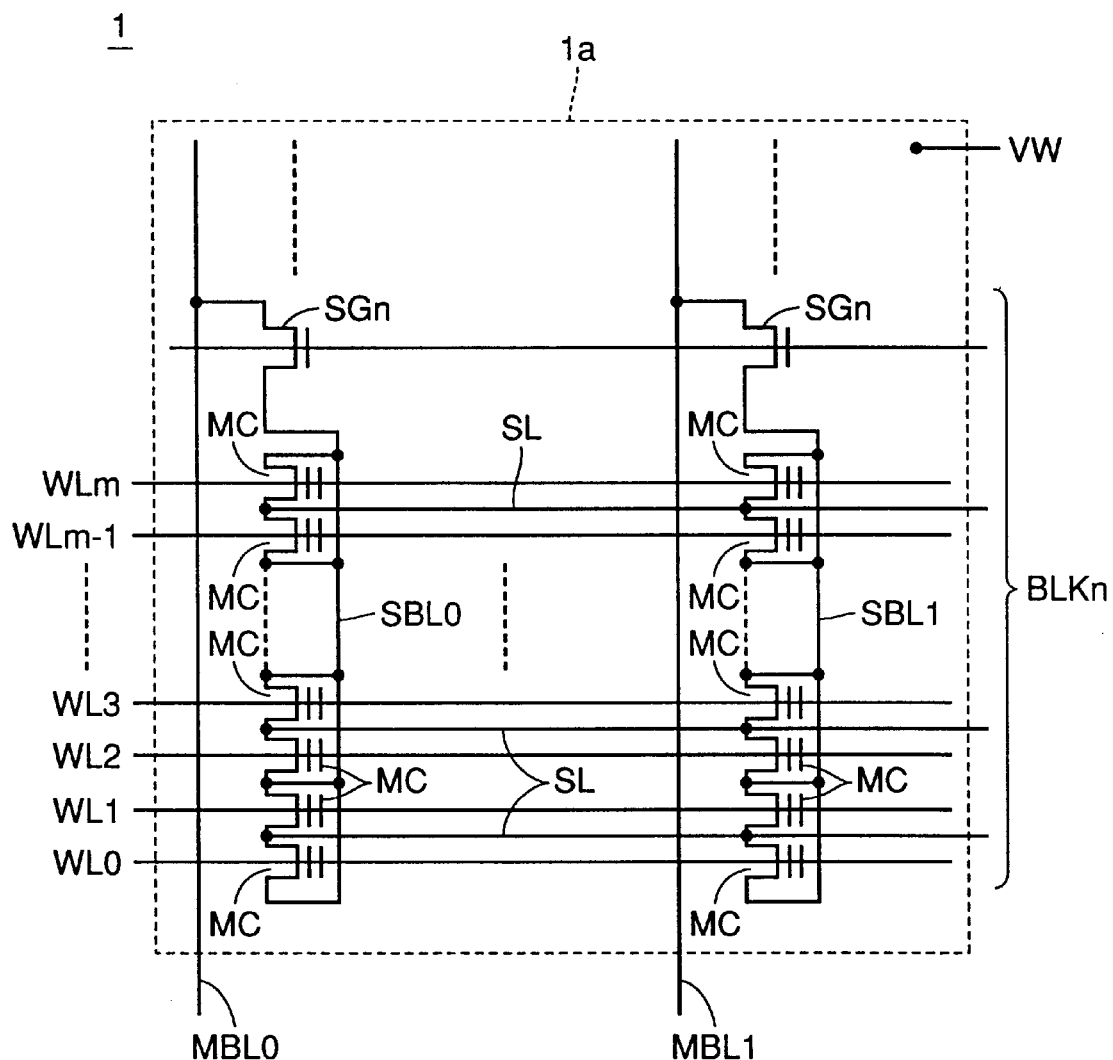
FIG. 2 is a circuit diagram showing a structure of the memory array of FIG. 1.

Memory array 1 includes a plurality of memory blocks BLK0–BLKn (where n is an integer of at least 0) formed at the surface of a well 1a of a semiconductor substrate. Each of memory blocks BLK0–BLKn includes a plurality of memory cells MC arranged in a plurality of rows and columns as shown in FIG. 2, a plurality of word lines WL0–WLm (where m is an integer of at least 0) provided corresponding to the plurality of rows respectively, a source line SL provided corresponding to two adjacent rows, a plurality of sub bit lines SBL0 and SBL1 provided corresponding to the plurality of columns, respectively (in the drawing, only two rows are depicted for the sake of simplification), and a select gate SG (N channel MOS transistor) provided corresponding to each column. A plurality of main bit lines MBL0 and MBL1 are provided in common to memory blocks BLK0–BLKn. Each sub bit line SBL0 is connected to a main bit line MBL via select gate SG.

Figure 3A:
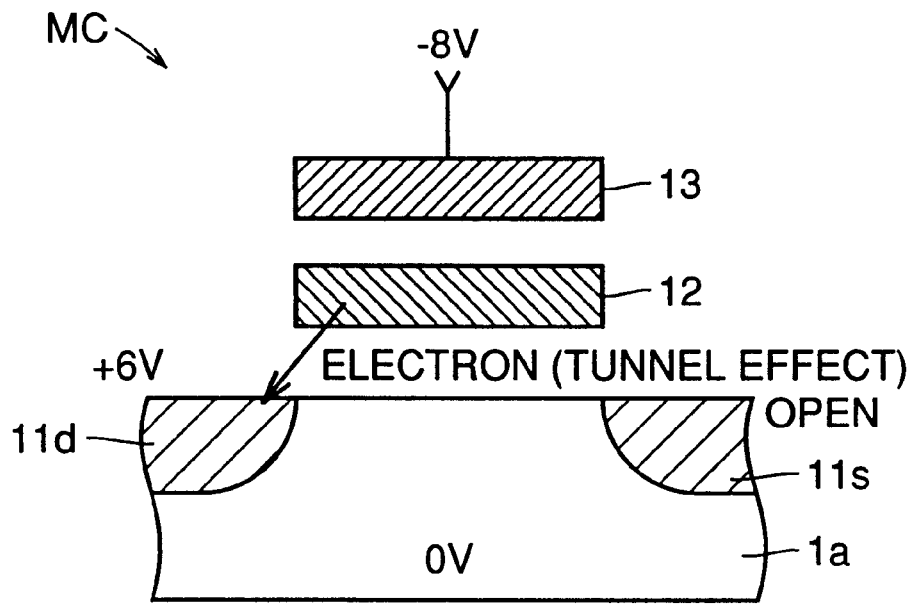
FIGS. 3A and 3B are diagrams for describing the structure and operation of the memory cell of FIG. 2, respectively.
Figure 3B:
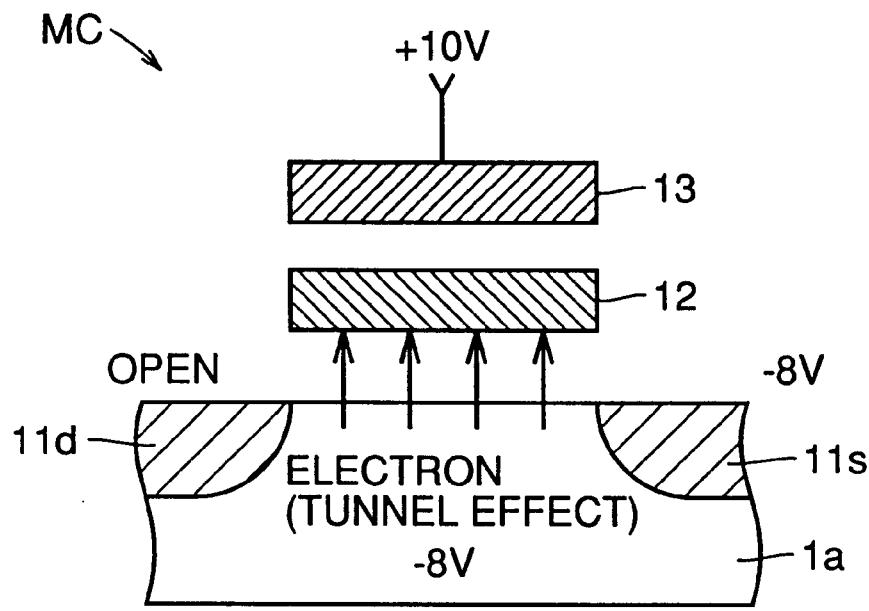

As shown in FIGS. 3A and 3B, each memory cell MC has a floating gate 12 formed above the surface of well 1a with an insulation layer therebetween, then an insulation layer and a control gate 13 there above, and also a source 11s and a drain 11d formed at respective surfaces of well 1a at both sides of gates 12 and 13. Control gate 13, drain 11d and source 11s are connected to a corresponding word line WL, sub bit line SBL, and source line SL, respectively.

In a write operation, +6V and −8V are applied to drain 11d and control gate 13, respectively, of memory cell MC as shown at the top row of the following Table 1. Source 11s is open (floating), and well 1a is connected to ground. Accordingly, electrons are drawn out from floating gate 12 towards drain 11d by the tunnel effect as shown in FIG. 3A, whereby the threshold voltage Vth of memory cell MC drops to 2V as shown in FIG. 4. In other words, data "0" is written.

TABLE 1

|  | Drain | Gate | Source | Well |
| --- | --- | --- | --- | --- |
| Write | +6 V | −8 V | Open | 0 V |
| Erase | Open | +10 V | −8 V | −8 V |
| Read | 1 V | +3.3 V | 0 V | 0 V |

In an erasure operation, +10V is applied to control gate 13 of memory cell MC, and −8V is applied to source 11s and well 1a. Drain 11d is open. Accordingly, electrons are injected from source 11s and well 1a into floating gate 12 by the tunnel effect as shown in FIG. 3B, whereby the threshold voltage Vth of memory cell MC rises to approximately 6V as shown in FIG. 4. In other words, data "1" is written.

In a read operation, 1V is applied to drain 11d of memory cell MC, and +3.3V is applied to control gate 13, as indicated in the bottom line of Table 1. 0V is applied to source 11s and well 1a. Detection is made whether a threshold current Ith (generally, several ten μA) across drain 11d and source 11s as shown in FIG. 4. Current Ith flows only when data "0" is written in memory cell MC.

In a write verify operation, 1V is applied to drain 11d of memory cell MC. A voltage (for example 2.5V) slightly greater than the target threshold voltage Vth is applied to control gate 13. 0V is applied to source 11s and well 1a. Detection is made whether a predetermined current Ic flows across drain 11d and source 11s. It is to be noted that data writing is carried out with the operation divided into a plurality of times to eliminate variation in the threshold voltage Vth of memory cell MC. Data writing is ceased at the time point current Ic is detected. Data writing is classified into the method of applying the same voltage every time to the main bit line MBL (drain 11d of memory cell MC) as shown in FIG. 5A, and the method of gradually increasing the voltage applied to the main bit line MBL as shown in FIG. 5B.

In an erasure verify operation, 1V is applied to drain 11d of memory cell MC, and a voltage (for example, 5.5V) slightly smaller than the target threshold voltage Vth is applied to control gate 13. 0V is applied to source 11s and well 1a. Detection is made whether current Ic flows across drain 11d and source 11s. Data erasure is carried out until the threshold voltage Vth of memory cell MC becomes approximately 6V. Data erasure is ceased at the time point current Ic is no longer detected.

Referring to FIG. 1 again, X decoder 2 selects any of the plurality of word lines WL according to an address signal Add to apply voltages −8V, +10V, +3.3V, +2.5V or +5.5V corresponding to the operation mode to the selected word line WL. Y decoder 3 selects any of the plurality of main bit lines MBL according to address signal Add.

SG·SL decoder 4 selects any of the plurality of memory blocks BLK0–BLKn (for example, BLKn) according to address signal Add to render select gate SGn of the selected memory block BLKn conductive. Sub bit lines SBL0 and SBL1 of selected memory block BLKn are coupled to main bit lines MBL0 and MBL1, respectively. SG·SL decoder 4 sets the well voltage VW to 0V or −8V and source line SL to an open state, 0V or −8V, according to the operation mode.

In a write operation, write·read circuit 5 writes data into a memory cell MC selected by decoders 2–4 according to an externally applied data Din via input buffer 6. More specifically, write·read circuit 5 applies a write voltage (for example +6V) in a pulsive manner to main bit line MBL selected by decoder 3, and then 1V to that main bit line MBL to detect whether current Ic flows or not, and then ceases data writing in response to the flow of current Ic.

In a read out operation, writeread circuit 5 applies IV to drain 11d of selected memory cell MC via main bit line MBL, select gate SG and sub bit line SBL selected by decoders 3 and 4. Detection is made whether current flows or not. Data corresponding to the detected result is provided outside via output buffer 7. In an erasure verify operation, write·read circuit 5 applies 1V to the drain of the selected memory cell MC to detect whether current Ic flows or not. The erasure operation is ceased in response to current Ic no longer conducted.

Voltage generation circuits 8.1–8.i generate various voltages used by decoders 2 and 4 and write read circuit 5 in each of the writing, reading, erasing, and verifying operations. At least one of voltage generation circuits 8.1–8.i generates a positive high voltage. The other circuits generate a negative high voltage. At least one of voltage generation circuits 8.1–8.i generates a voltage of a plurality of stages. Distributor 9 distributes voltages VP1–VPi generated by voltage generation circuits 8.1–8.1 to decoders 2 and 4 and write·read circuit 5 according to the operation mode.

Control circuit 10 responds to externally applied control signals /CE, /OE, /WE and an externally applied command signal CMD via input buffer 6 to select a predetermined operation mode for control of the entire flash memory.

The operation of this flash memory will be described now. First, control signals /CE, /OE, /WE and command signal CMD are applied to control circuit 10 to set the operation mode.

In a write operation, −8V is applied to word line WL corresponding to memory cell MC addressed by address signal Add. That memory cell MC is connected to main bit line MBL via select gate SG. Source line SL is rendered open, and well voltage VW is set to 0V. In this state, +6V is applied in a pulsive manner to main bit line MBL by write-read circuit 5. Data "0" is written into selected memory cell MC over a plurality of times. Verification of whether writing data "0" has ended, i.e. whether threshold voltage Vth of memory cell MC becomes 2V or not, is made by write-read circuit 5.

In an erase operation, source line SL and well voltage VW are set to −8V. In this state, +10V is applied in a pulsive manner to word line WL specified by address signal Add. Data in memory cell MC connected to word line WL is erased over a plurality of times. Verification of whether data erasure has ended or not, i.e. whether the threshold voltage Vth of memory cell MC has become 6V, is made by write read circuit 5.

In a read operation, memory cell MC specified by address signal Add is connected to write-read circuit 5 via sub bit line SBL, select gate SG and main bit line MBL. +3.3V is applied to word line WL corresponding to that memory cell MC. The data in memory cell MC is read out by write-read circuit 5 and output via output buffer 7.

Figure 6:
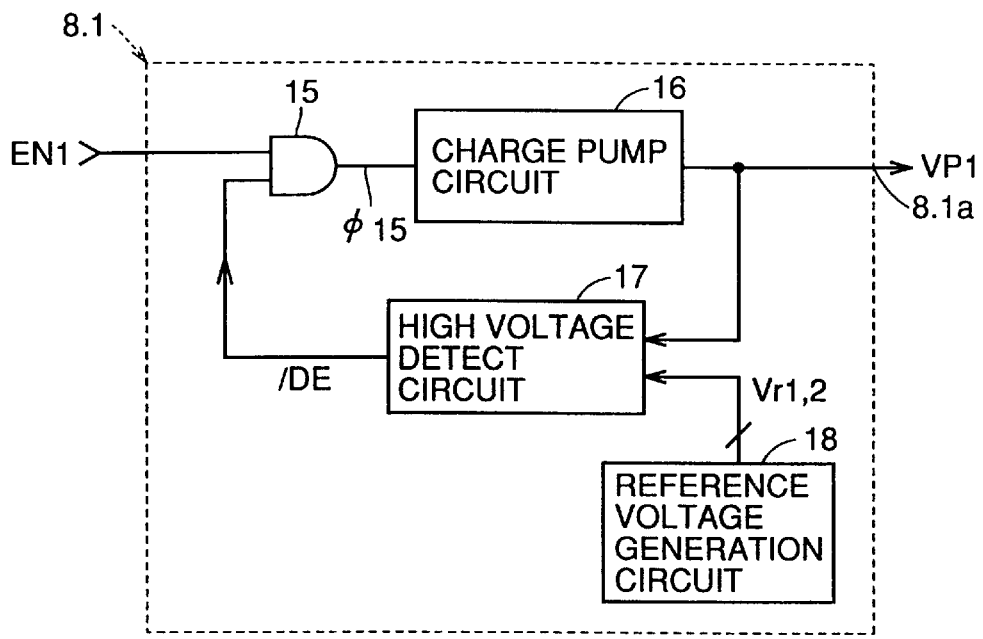
FIG. 6 is a circuit block diagram showing a structure of a voltage generation circuit 8.1 of FIG. 1.

The voltage detection method which is the feature of the present application will be described hereinafter with reference to the circuit block diagram of FIG. 6. In FIG. 6, voltage generation circuit 8.1 is a circuit generating a positive high voltage used within the flash memory, and includes an AND gate 15, a charge pump circuit 16, a positive high voltage detect circuit 17 and a reference voltage generation circuit 18.

Charge pump circuit 16 is activated during the activation period of an H level of signal φ15 output from AND gate 15 to discharge the negative charge from output terminal 8.1a of voltage generation circuit 8.1 at the rate of a predetermined amount per unit time to raise the potential of output terminal 8.1a. Reference potential generation circuit 18 generates and applies to high voltage detection circuit 17 positive reference voltages Vr1 and Vr2. High voltage detect circuit 17 determines whether output voltage VP1 of voltage generation circuit 8.1 has arrived at the target voltage according to reference voltages Vr1 and Vr2. Output signal /DE of high voltage detect circuit 17 attains an active state of an L level when output signal VP1 has arrived at the target voltage. AND gate 15 receives a charge pump activation signal EN 1 from control circuit 10 and high voltage detect signal /DE from high voltage detect circuit 17.

When signals EN1 and /DE both are at an H level, signal φ15 attains the active state of an H level to render charge pump circuit 12 active. When at least one of signals EN1 and /DE is at an L level, signal φ15 attains an L level of an inactive level to render charge pump circuit 16 inactive. Accordingly, output voltage VP1 of voltage generation circuit 8.1 is maintained at the target voltage.

Figure 7:
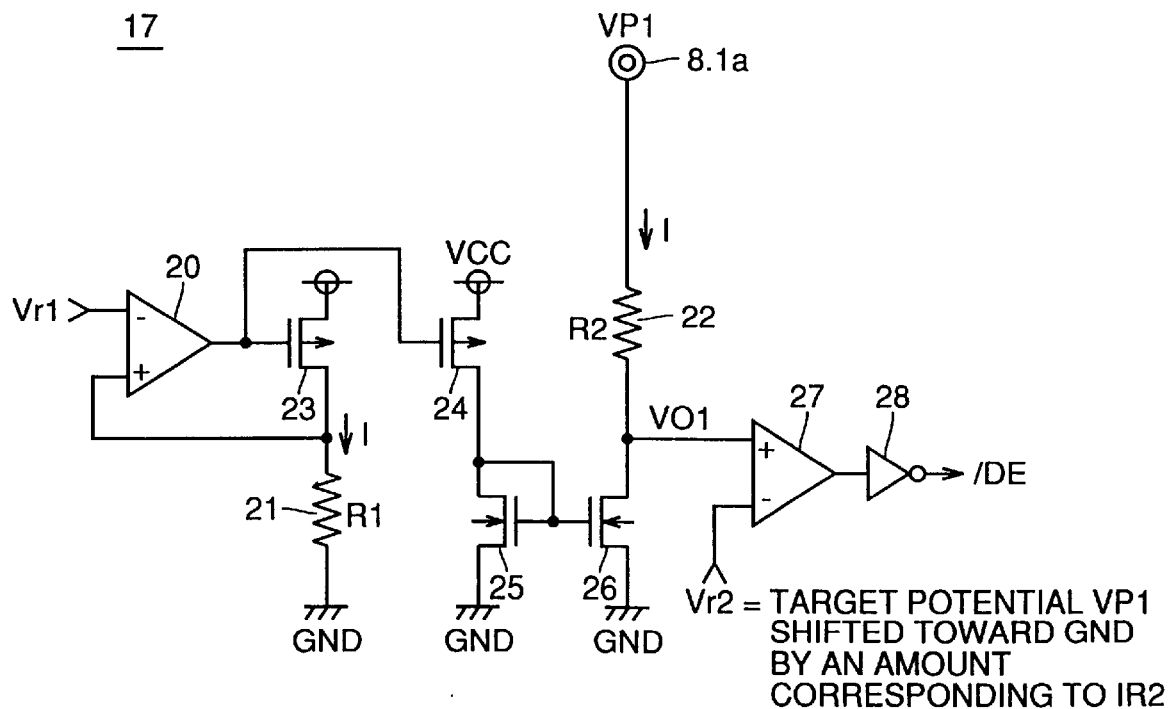
FIG. 7 is a circuit diagram showing a structure of a positive high voltage detect circuit of FIG. 6.

FIG. 7 is a circuit diagram showing a structure of positive high voltage detect circuit 17 of FIG. 6.

Referring to FIG. 7, high voltage detect circuit 17 includes an operational amplifier 20, resistance elements 21 and 22, P channel MOS transistors 23 and 24, N channel MOS transistors 25 and 26, a comparator 27 and an inverter 28. P channel MOS transistor 23 and resistance element 21 are connected in series between the line of power supply potential VCC and the line of ground potential GND. Operational amplifier 20 has its inverting input terminal receive reference voltage Vr1 and its noninverting input terminal connected to the drain of P channel MOS transistor 23, and its output applied to the gate of P channel MOS transistor 23.

P channel MOS transistor 24 and N channel MOS transistor 25 is connected in series between the lines of power supply potential VCC and ground potential GND. Resistance element 22 and N channel MOS transistor 26 are connected in series between output terminal 8.1a of voltage generation circuit 8.1 and the line of ground potential GND. P channel MOS transistors 23 and 24 have their gates connected to each other. N channel MOS transistors 25 and 26 have their gates connected to the drain of N channel MOS transistor 25. N channel MOS transistors 25 and 26 form a current mirror circuit. Comparator 27 compares potential VO1 of the drain of N channel MOS transistor 26 with reference potential VR2. In response to VO1 exceeding Vr2, comparator 27 has its output pulled up to an H level from an L level. The output of comparator 27 is inverted by inverter 28 to be provided as signal /DE.

The operation of high voltage detect circuit 17 will be described now. Operational amplifier 20 controls the gate potential of P channel MOS transistor 23 so that the voltages of the inverting input terminal and the noninverting input terminal are identical. Therefore, when the resistance value of resistance element 21 is R1 and the current I flowing through resistance element 21 is I, then Vr1=R1·I.

P channel MOS transistors 23 and 24 have their gates connected to each other. P channel MOS transistor 24 and N channel MOS transistor 25 are connected in series. N channel MOS transistors 25 and 26 form a current mirror circuit. Since resistance element 22 and N channel MOS transistor 26 are connected in series, the same current I flows through resistance elements 21 and 22.

Therefore, when the resistance value of resistance element 22 is R2, the drain potential VO1 of N channel MOS transistor 26 becomes VO1=VP1−R2·I=VP1−Vr1·(R2/R1), so that the voltage conversion factor ΔVO1/ΔVP1 becomes 1. Therefore, the detection accuracy of high voltage detect circuit 17 becomes higher than the conventional case where the voltage conversion factor is smaller than 1.

When VO1 becomes higher than Vr2, detect signal /DE attains an L level, whereby charge pump circuit 16 is rendered inactive. When VO1 becomes lower than Vr2, detect signal /DE attains an H level, whereby charge pump circuit 16 is rendered active. The The reference voltage Vr2 is equivalent to the target potential shifted in level towards the ground potential by an amount corresponding to the value of $R_2$ multiplied by the value of current I, as shown symbolically in FIG. 7. Persons of ordinary skill in the art would be able to implement this function easily, and hence a detailed implementation is not described.

Figure 8:
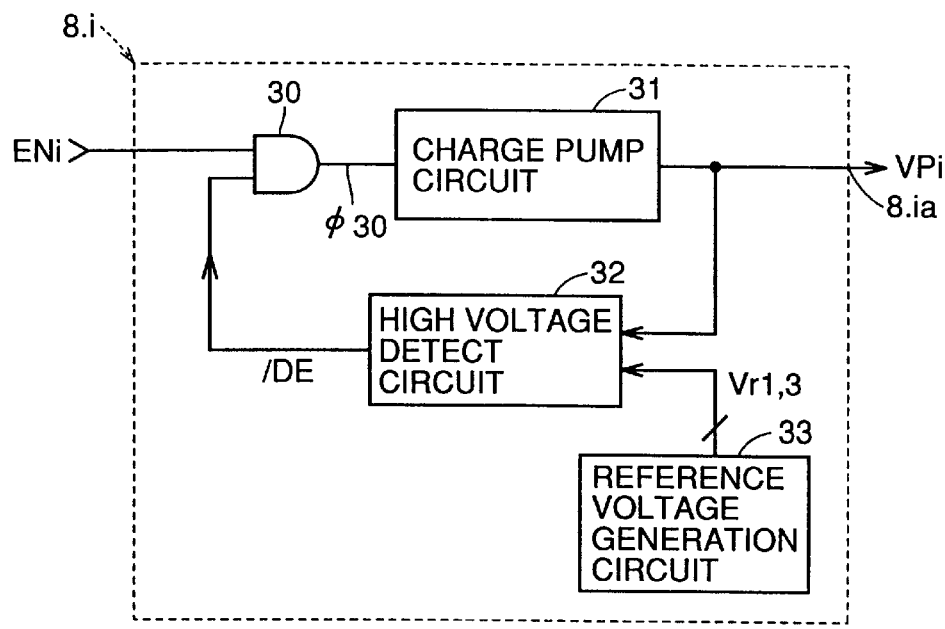
FIG. 8 is a circuit block diagram showing a structure of a voltage generation circuit 8.i of FIG. 1.

FIG. 8 is a circuit block diagram showing a structure of voltage generation circuit 8.i of FIG. 1. Voltage generation circuit 8.i of FIG. 8 generates a negative high voltage used within the flash memory, and includes an AND gate 30, a charge pump circuit 31, a high voltage detect circuit 32, and a reference voltage generation circuit 33.

Charge pump circuit 31 is rendered active during the active state of an H level of output signal φ30 from AND gate 30 to discharge the positive charge from output terminal 8ia of voltage generation circuit 8.i at a rate of a predetermined amount per unit time to reduce the potential of output terminal ia. Reference voltage generation circuit 33 generates and provides to high voltage detect circuit 32 a positive reference voltage Vr1 and a negative reference voltage Vr3. High voltage detect circuit 32 determines whether output voltage VPi of voltage generation circuit 8.i has arrived at the target voltage according to reference voltages Vr1 and Vr3. Output signal /TE of high voltage detect circuit 32 attains an active state of an L level when output voltage VPi has arrived at the target voltage. AND gate 30 receives charge pump activation signal ENi from control circuit 10 and detect signal /DE from high voltage detect circuit 32.

When signals ENi and /DE are both at an H level, signal φ30 attains an active state of an H level, whereby charge pump circuit 31 is rendered active. When at least one of signals ENi and /DE is at an L level, signal φ30 attains an inactive state of an L level, whereby charge pump circuit 31 is rendered inactive. Therefore, output voltage VPi of voltage generation circuit 8.i is maintained at the target voltage.

Figure 9:
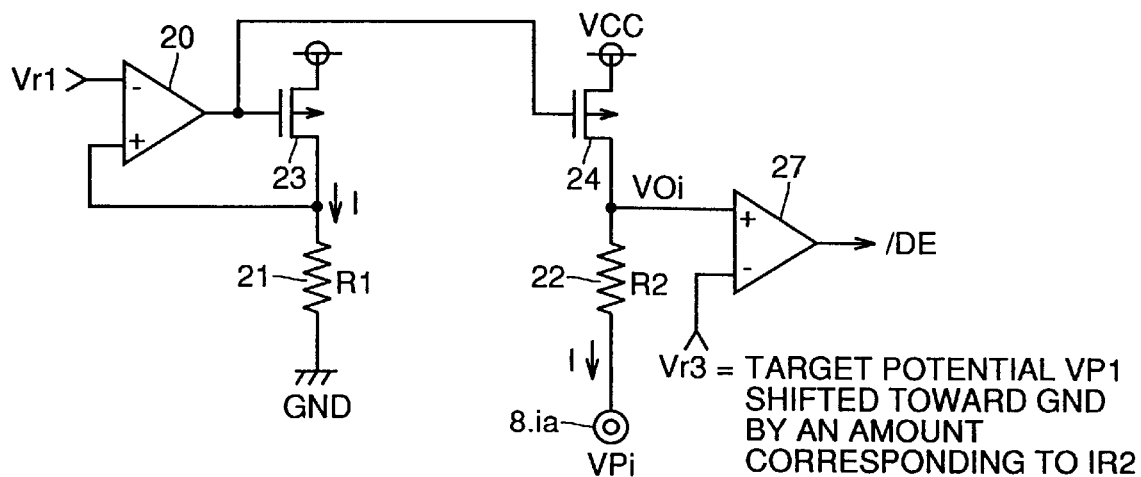
FIG. 9 is a circuit diagram showing a structure of a negative high voltage detect circuit of FIG. 8.

FIG. 9 is a circuit diagram showing a structure of negative high voltage detect circuit 32 of FIG. 8, and corresponds to FIG. 7. High voltage detect circuit 32 of FIG. 9 differs from high voltage detect circuit 17 of FIG. 7 in that N channel MOS transistors 25 and 26 are removed, resistance element 22 is connected between the drain of P channel MOS transistor 24 and output terminal 8.i*a*, negative reference voltage Vr3 is applied to comparator 27 instead of positive reference voltage Vr2, and that inverter 28 is removed.

The drain potential VOi of P channel MOS transistor 24 is VOi=VPi+R2·I=VPi+Vr1·(R2/R1), so that the voltage conversion factor ΔVOi/ΔVPi becomes 1. Therefore, the detection accuracy of high voltage detect circuit 2 becomes higher than the conventional case where the voltage conversion factor is lower than 1.

When VOi becomes lower than Vr3, detect signal /DE attains an L level, whereby charge pump circuit 31 is rendered inactive. When VOi becomes higher than Vr3, detect signal /DE attains an H level, whereby charge pump circuit 31 is rendered active.

Second Embodiment

Figure 10:
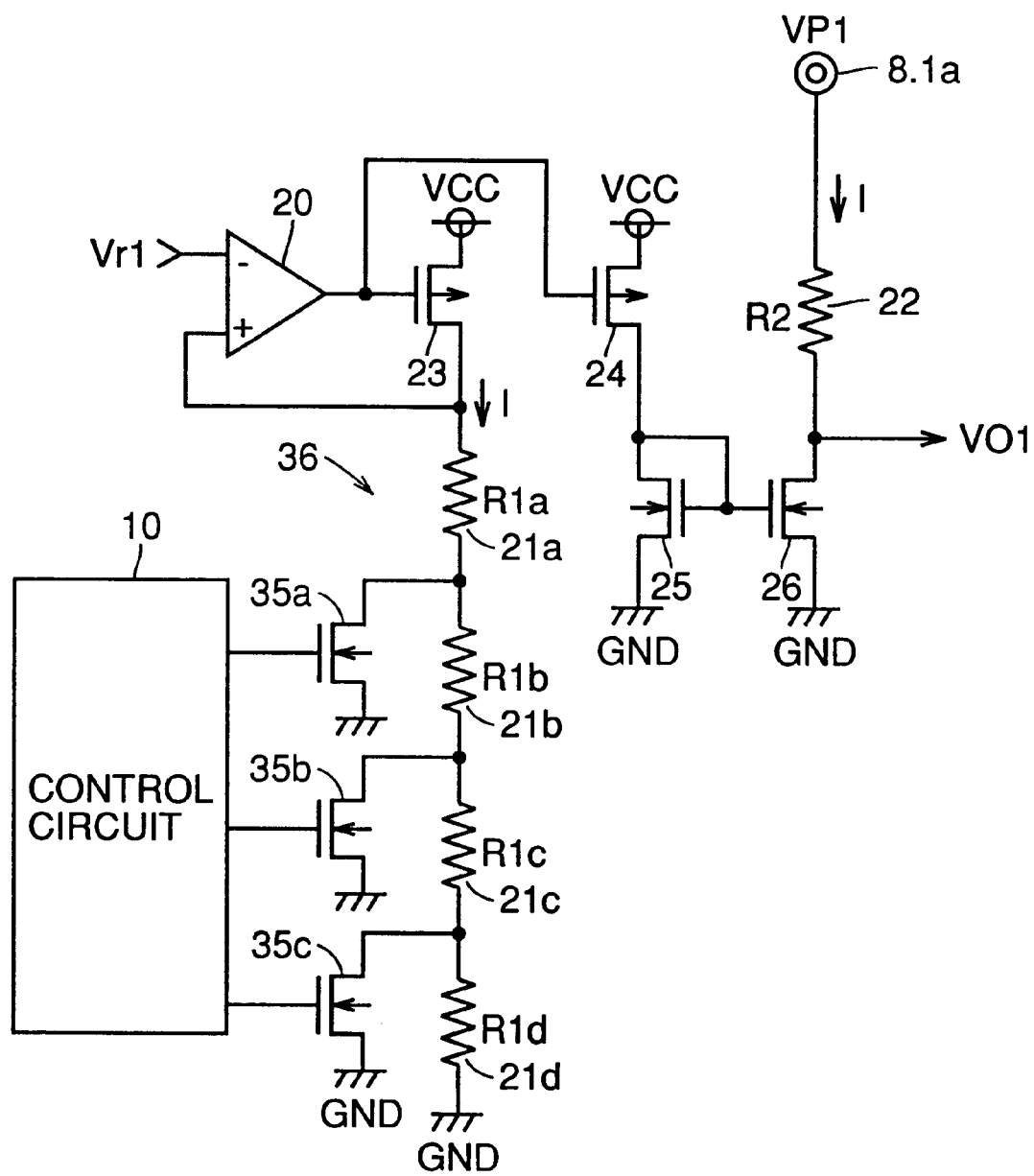
FIG. 10 is a circuit block diagram showing main components of a positive high voltage detect circuit of a flash memory according to a second embodiment of the present invention.

FIG. 10 is a circuit block diagram showing main components of a positive high voltage detect circuit of a flash memory according to a second embodiment of the present invention, and corresponds to FIG. 7. The high voltage detect circuit of FIG. 10 differs from high voltage detect circuit 17 of FIG. 7 in that resistance element 21 is substituted with a variable resistance circuit 36.

Variable resistance circuit 36 includes a plurality of (four in the drawing) resistance elements 21*a*–21*d* connected in series between the drain of P channel MOS transistor 23 and the line of power supply potential GND, and a plurality of (in this case, 3) N channel MOS transistors 35*a*–35*c*. Resistance elements 21*a*–21*d* have resistance values R1*a*–R1*d*, respectively. N channel MOS transistor 35*a* is connected in parallel to resistance elements 21*b*–21*d*. N channel MOS transistor 35*b* is connected in parallel to resistance elements 21*c* and 21*d*. N channel MOS transistor 35*c* is connected in parallel to resistance element 21*d*. N channel MOS transistors 35*a*–35*c* have their gates connected to control circuit 10.

The conductive resistance values of N channel MOS transistors 35*a*–35*c* are sufficiently smaller than the resistance values of resistance elements 21*a*–21*d*. Resistance value R1 of variable resistance circuit 36 is varied by rendering any of N channel MOS transistors 35*a*–35*c* conductive by control circuit 10. Accordingly, output voltage VP1 can be modified. More specifically, a smaller value of resistance R1 of variable resistance circuit 36 causes a greater current i, so that VP1−VO1=R2·I becomes greater. By maintaining VO1 at Vr2, VP1 becomes higher. In contrast, when resistance value R1 of variable resistance circuit 36 is increased, current I becomes smaller so that VP1−VO1=R2·I becomes smaller. Therefore, VP1 becomes lower by maintaining VO1 at Vr2. This high voltage detect circuit is effective when the output voltage of the voltage generation circuit is sequentially increased, as shown in FIG. 5B.

Since VO1=VP1−Vr1·(R2/R1), the ratio of the change ΔR1 of R1 to the change ΔVO1 of VO1 becomes ΔVO1/ΔR1=Vr1·(R2/R1$^2$).

Figure 11:
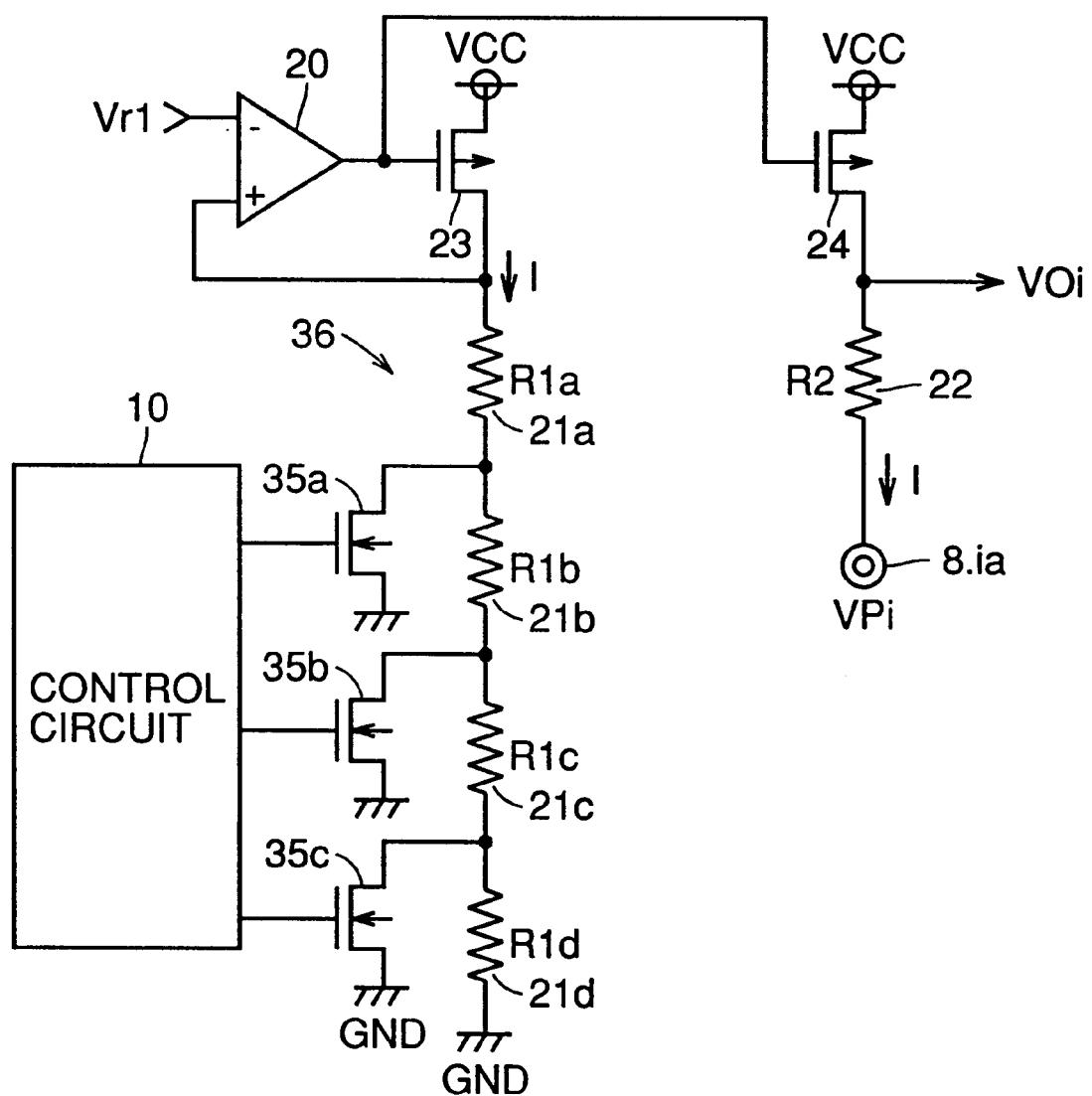
FIG. 11 is a circuit block diagram showing main components of a negative high voltage detect circuit which is a modification of the high voltage detect circuit of FIG. 10.

As shown in FIG. 11, resistance element 21 of negative high voltage detect circuit 32 of FIG. 9 may be substituted with variable resistance circuit 36. In this case, a smaller resistance value R1 of variable resistance circuit 36 causes a greater current I to result in a greater VOi−VPi=R2·I. Therefore, VPi becomes lower by maintaining VOi at Vr3. In contrast, when resistance value R1 of variable resistance circuit 36 is increased, current I becomes smaller so that VOi−VPi=R2·I is reduced. Therefore, VPi becomes higher by maintaining VO1 at Vr3.

Third Embodiment

Figure 12:
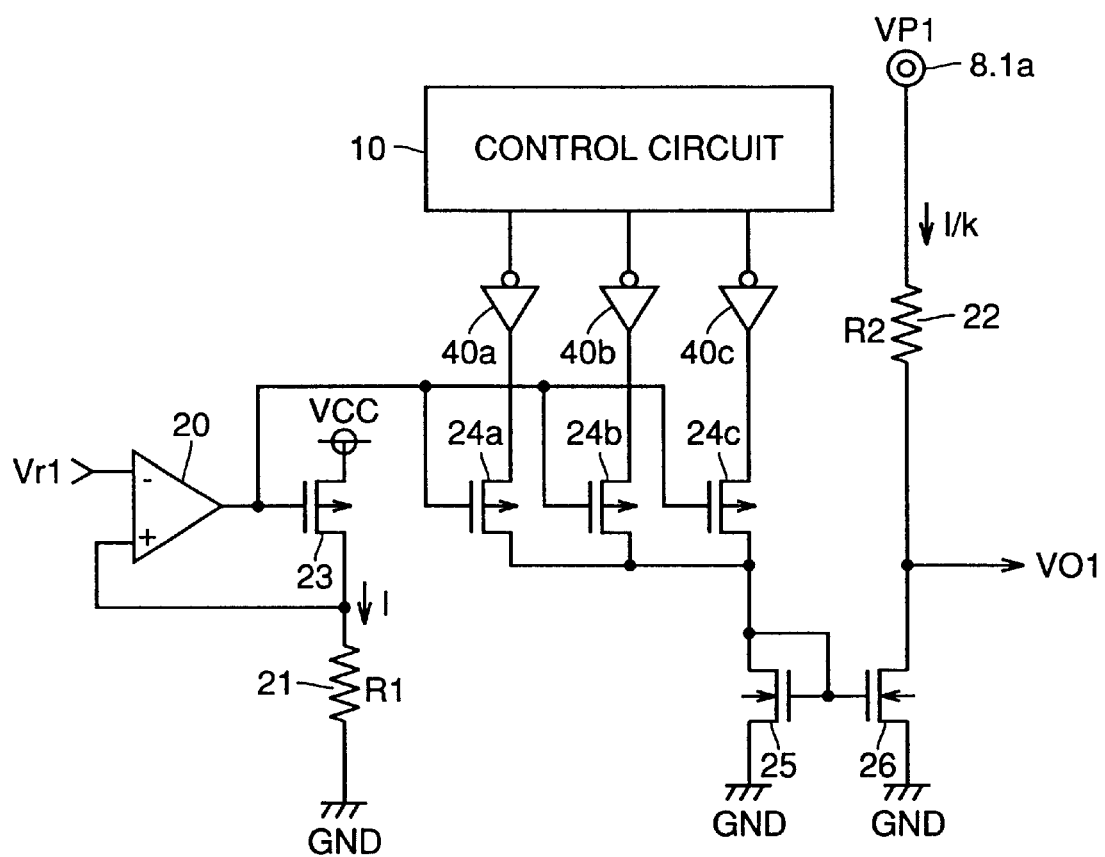
FIG. 12 is a circuit block diagram showing main components of a positive high voltage detect circuit of a flash memory according to a third embodiment of the present invention.

FIG. 12 is a circuit block diagram showing main components of a positive high voltage detect circuit of a flash memory according to a third embodiment of the present invention, and corresponds to FIG. 7. The high voltage detect circuit of FIG. 12 differs from high voltage detect circuit 17 of FIG. 7 in that P channel MOS transistor 24 is substituted with a plurality (3, in FIG. 12) of P channel MOS transistors 24*a*–24*c*, and that inverters 40*a*–40*c* are newly provided corresponding to P channel MOS transistors 24*a*–24*c*, respectively.

Inverters 40*a*–40*c* are connected between control circuit 10 and respective sources of P channel MOS transistors 24*a*–24*c*. P channel MOS transistors 24*a*–24*c* have their drains connected to the drain of N channel MOS transistor 25, and their gates connected to the gate of P channel MOS transistor 23.

The gate width of each of P channel MOS transistors 24*a*–24*c* is sequentially increased. By driving the input node of any one of inverters 40*a*–40*c* to an L level by control circuit 10, the ratio k of the current I flowing through resistance element 21 to current I/k flowing through resistance element 20 can be altered, whereby output voltage VP1 can be modified.

Since VO1=VP1−I·R2/k=VP1−Vr1·(R2/kR1) in the circuit, the ratio of the change ΔVO1 of VO1 to the change Δk of k becomes ΔVO1/Δk=Vr1·(R2/R1·k$^2$).

Figure 13:
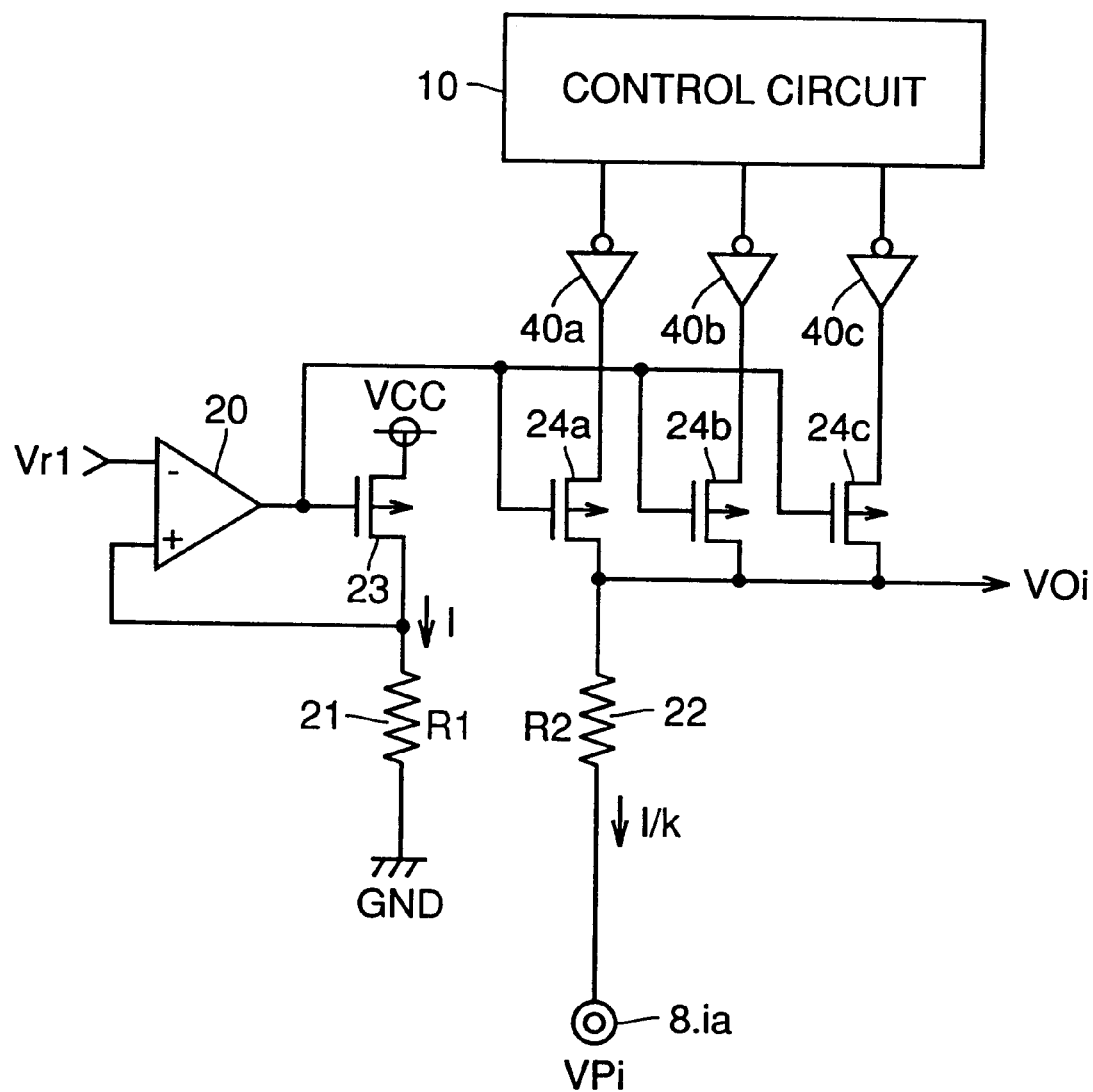
FIG. 13 is a circuit block diagram showing main components of a negative high voltage detect circuit which is a modification of the high voltage detect circuit of FIG. 12.

As shown in FIG. 13, P channel MOS transistor 24 of negative high voltage detect circuit 32 of FIG. 9 can be substituted with P channel MOS transistors 24*a*–24*c*. In this case, by driving the input node of any one of inverters 40*a*–40*c* to the L level by control circuit 10, the ratio k of the current I flowing through resistance element 21 to the current I/k flowing through resistance element 21 can be altered, whereby output voltage VPi can be modified.

Fourth Embodiment

Figure 14:
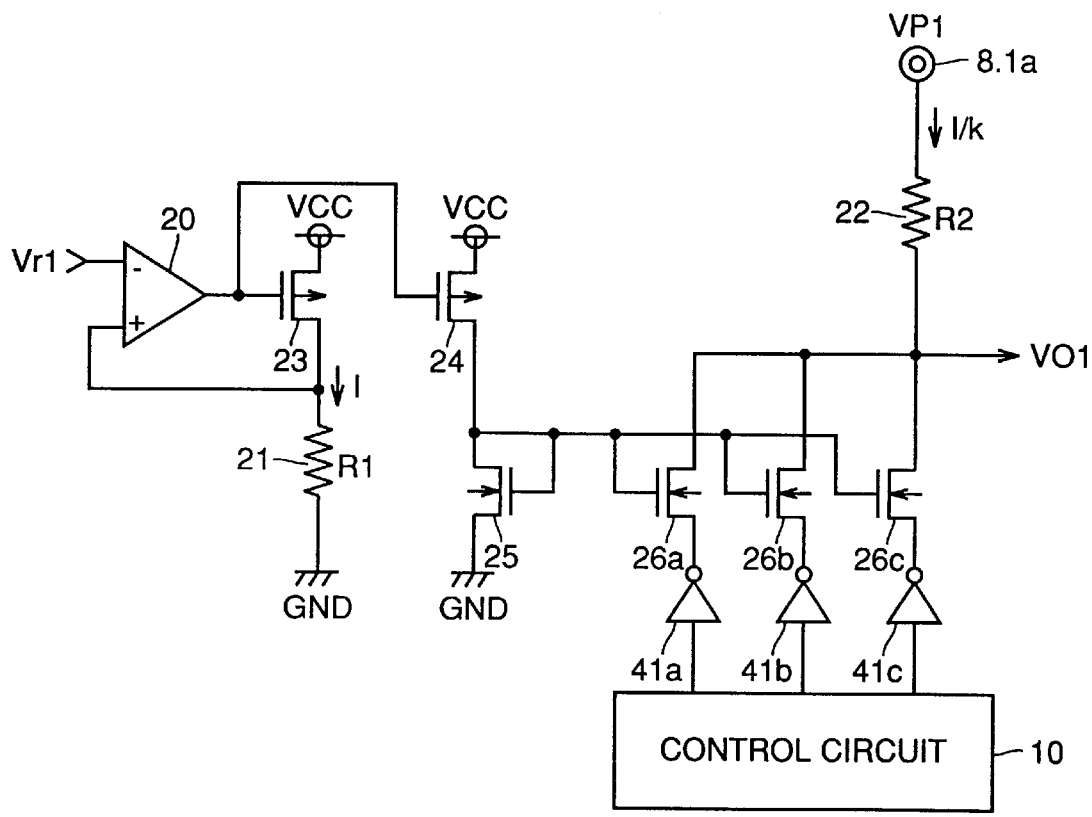
FIG. 14 is a circuit block diagram showing main components of a positive high voltage detect circuit of a flash memory according to a fourth embodiment of the present invention.

FIG. 14 is a circuit block diagram showing main components of a positive high voltage detect circuit of a flash memory according to a fourth embodiment of the present invention, corresponding to FIG. 7. The high voltage detect circuit of FIG. 14 differs from high voltage detect circuit 17 of FIG. 7 in that P channel MOS transistor 26 is substituted with a plurality of (in this case, 3) N channel MOS transistors 26*a*–26*c*, and that inverters 41*a*–41*c* are newly provided corresponding to P channel MOS transistors 26*a*–26*c*, respectively.

Inverters 41*a*–41*c* are connected between control circuit 10 and respective sources of N channel MOS transistors 26a–26c. N channel MOS transistors 26a–26c have their drains connected to output terminal 8.1a via common-connected resistance element 22. N channel MOS transistors 26a–26c have their gates connected to the gate of N channel MOS transistor 25.

The gate width of each of N channel MOS transistors 26a–26c is sequentially increased. By driving the input node of any one of inverters 41a–41c to an H level by control circuit 10, the ratio k of the current I flowing through resistance element 21 to the current I/k flowing through resistance element 22 can be altered, whereby output potential VP1 can be modified.

In this case, the ratio of the change ΔVO1 of VO1 to the change Δk of k is $\Delta VO1/\Delta k = Vr1 \cdot (R2/R1 \cdot k^2)$.

Fifth Embodiment

Figure 15:
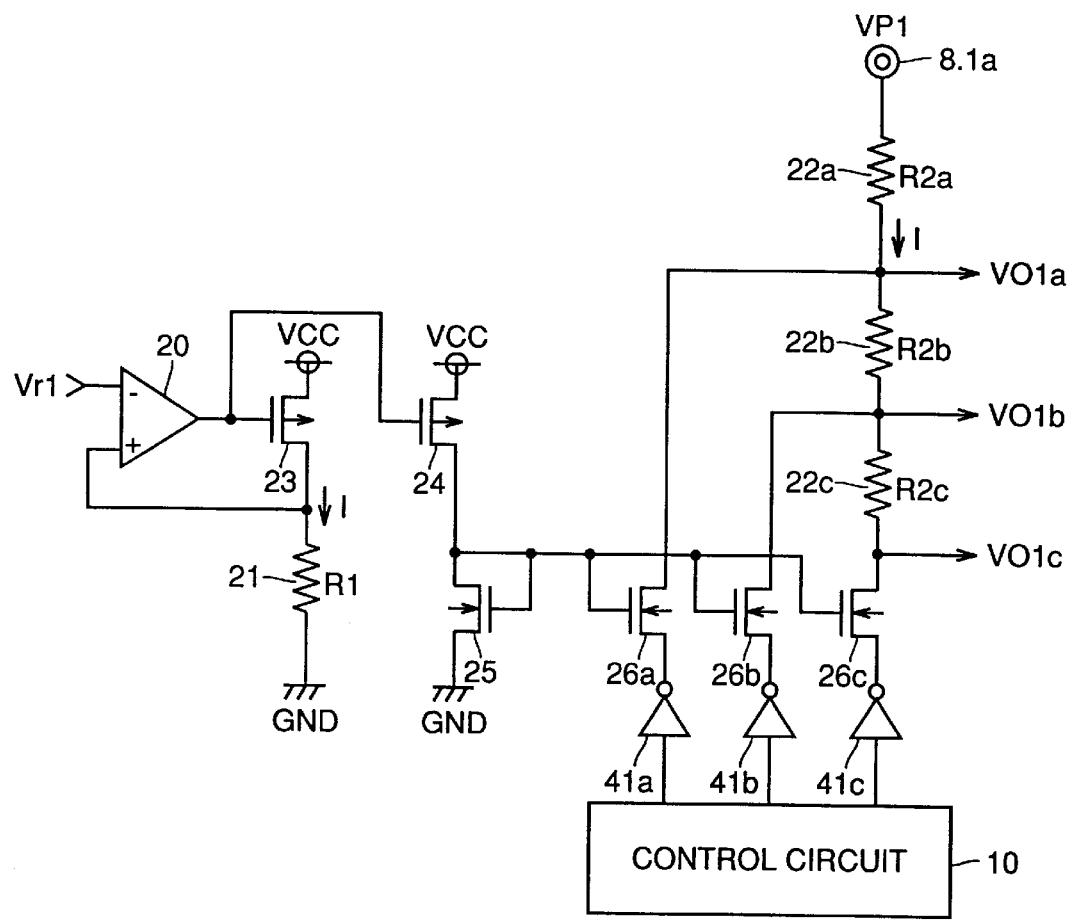
FIG. 15 is a circuit block diagram showing main components of a positive high voltage detect circuit of a flash memory according to a fifth embodiment of the present invention.

FIG. 15 is a circuit diagram showing main components of a positive high voltage detect circuit of a flash memory according to a fifth embodiment of the present invention, and corresponds to FIG. 14. The high voltage detect circuit of FIG. 15 differs from the high voltage detect circuit of FIG. 14 in that resistance element 22 is substituted with a plurality (in this case, 3) of resistance elements 22a–22c connected in series, N channel MOS transistor 26a has its drain connected to the node between resistance elements 22a and 22b, N channel MOS transistor 26b has its drain connected to the node between resistance elements 22b and 22c, and that the gate width of N channel MOS transistors 26a, 26b and 26c is set equal to the gate width of N channel MOS transistor 25. Resistance elements 22a–22c have resistance values R2a–R2c, respectively.

By driving the input node of any one of inverters 41a–41c to an H level by control circuit 10, the N channel MOS transistor through which current I flows can be switched, whereby output voltage VP1 can be modified.

More specifically, when the potentials appearing at respective drains of N channel MOS transistors 26a–26c are VO1a–VO1c, respectively, the potential becomes lower in the order of VO1a–VO1c. VP1 becomes higher by maintaining VO1a at Vr2, whereas VP1 becomes lower by maintaining VO1c at Vr2.

The potential used for potential detection out of VO1a–VO1c can be selected by a switch to be connected to comparator 27 of FIG. 7. Also, three comparators 27 receiving VO1a–VO1c, respectively, can be provided to select the output of the three comparators 27 with a switch, and apply the selected output to inverter 28 of FIG. 7.

When the sum of the resistance values of the path where current I flows through resistance elements 22a–22c is R2 and the potential used in potential detection is VO1, then VO1=VP1−Vr1·(R2/R1). Therefore, the ratio of the change ΔVO1 of VO1 to the change AR2 of R2 becomes ΔVO1/ΔR2=Vr1/R1, so that ΔVO1/ΔR2 takes a constant. Therefore, output voltage VP1 can be adjusted more minutely by using this high voltage detect circuit.

Figure 16:
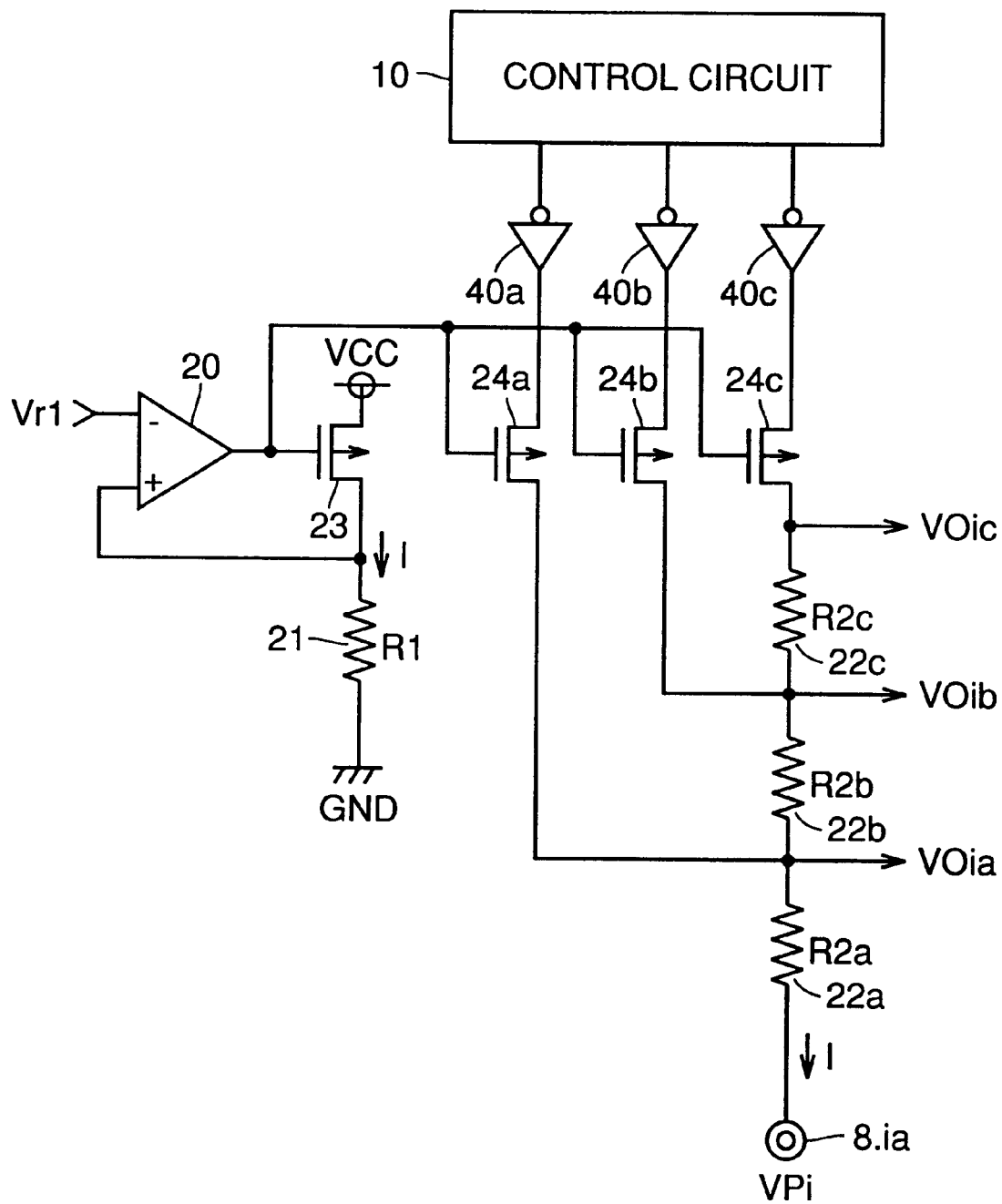
FIG. 16 is a circuit block diagram showing main components of a negative high voltage detect circuit which is a modification of the high voltage detect circuit of FIG. 15.

As shown in FIG. 16, resistance element 22 of the negative high voltage detect circuit of FIG. 13 can be substituted with a plurality of resistance elements 22a–22c connected in series between output terminal 8.ia and the drain of P channel MOS transistor 24c. Also, P channel MOS transistor 24a can have its drain connected to the node between resistance elements 22a and 22b. P channel MOS transistor 24a can have its drain connected to the node between resistance elements 22b and 22c. The gate width of P channel MOS transistors 23 and 24a–24c can be set equal. In this case, by driving the input node of any one of inverters 40a–40c to the L level, the P channel MOS transistor through which current I flows can be switched. Accordingly, output voltage VPi can be modified.

More specifically, when the potentials appearing at respective drains of P channel MOS transistors 24a–24c are VOia–VOic, respectively, the potential becomes lower in the order of VOia–VOic. Therefore, VPi becomes higher by maintaining VOia at the level of Vr3, and VPi becomes lower by maintaining VOic at the level of Vr3.

Figure 17:
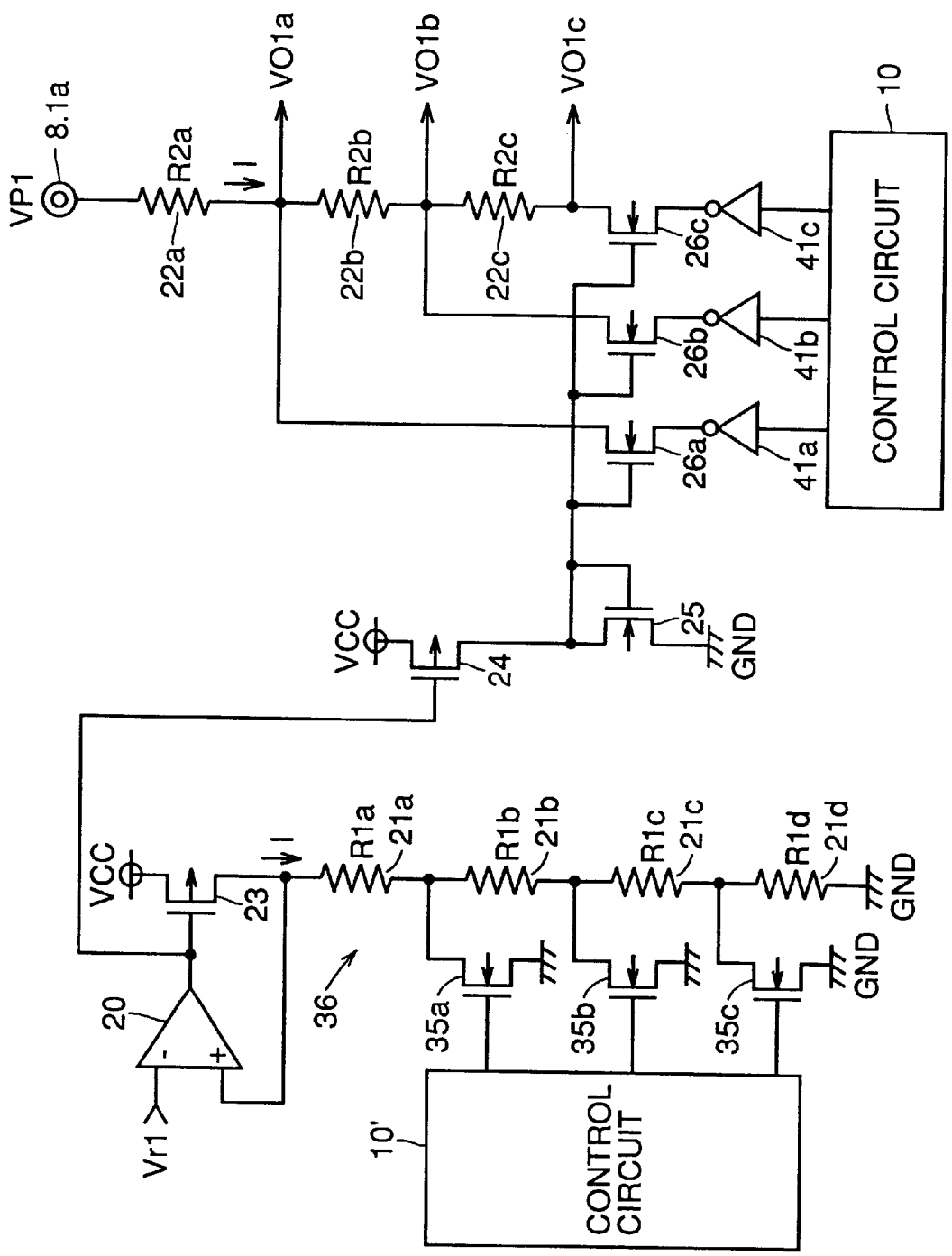
FIG. 17 is a circuit block diagram showing main components of a positive high voltage detect circuit which is another modification of the high voltage detect circuit of FIG. 15.
Figure 18:
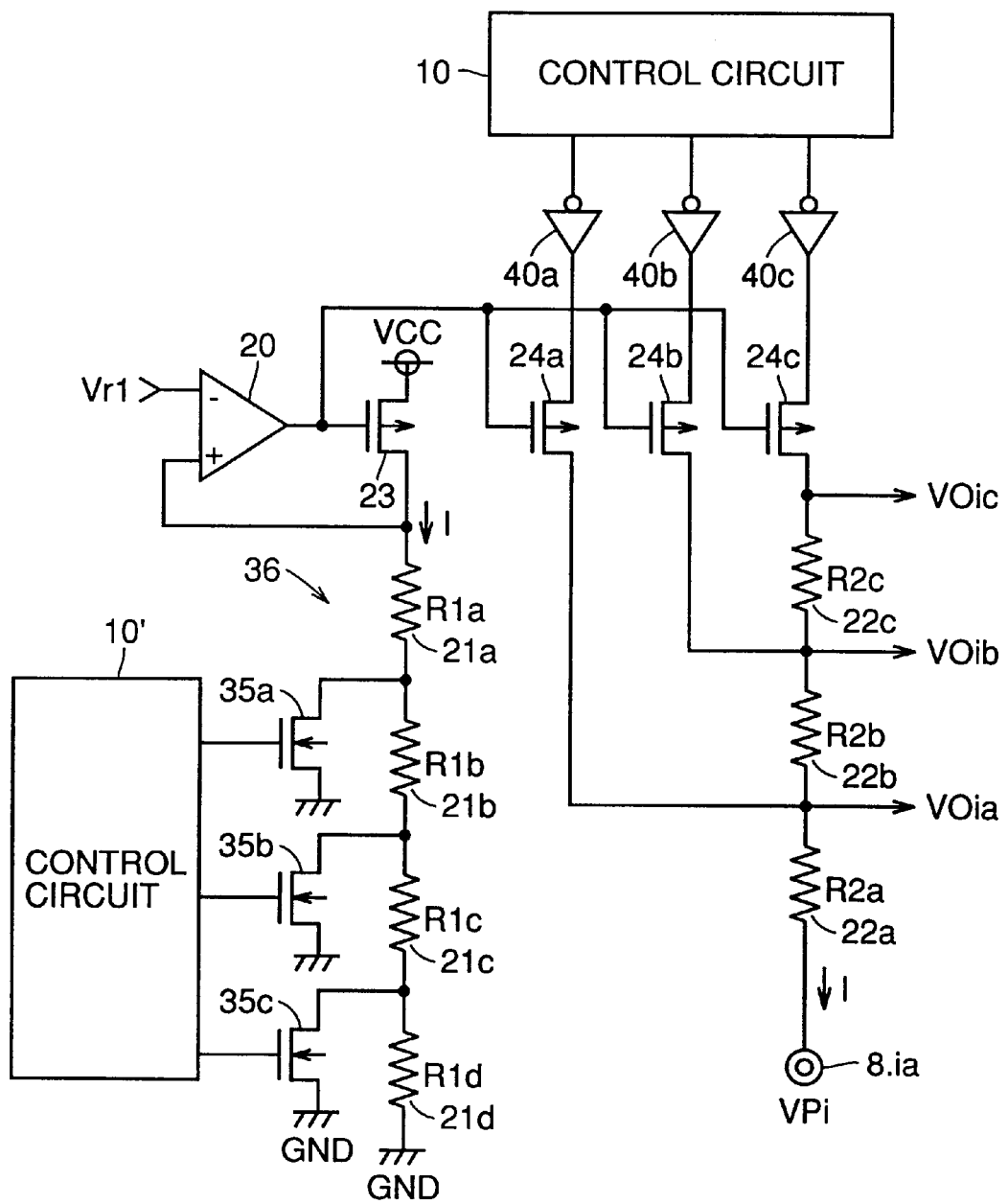
FIG. 18 is a circuit block diagram showing main components of a negative high voltage detect circuit which is a modification of the high voltage detect circuit of FIG. 16.

As shown in FIG. 17, resistance element 21 of the positive high voltage detect circuit of FIG. 15 can be substituted with variable resistance circuit 36 of FIG. 10. Also, resistance element 21 of the negative high voltage detect circuit of FIG. 16 can be substituted with variable resistance circuit 36 of FIG. 10, as shown in FIG. 18. Also, as shown in FIG. 19, P channel MOS transistor 24 of the positive high voltage detect circuit of FIG. 15 can be substituted with P channel MOS transistors 24a–24c of FIG. 12.

Figure 19:
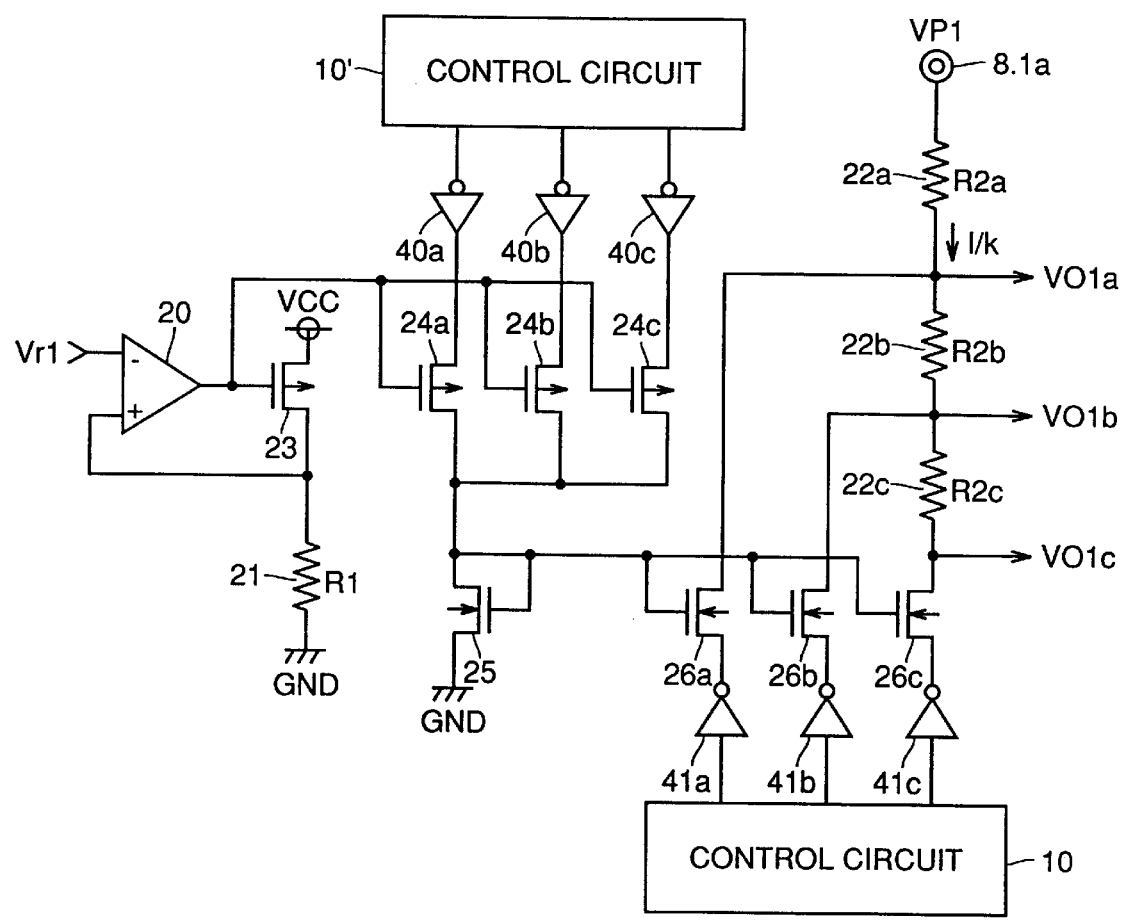
FIG. 19 is a circuit block diagram showing main components of a positive high voltage detect circuit which is a further modification of the high voltage detect circuit of FIG. 15.
Figure 20:
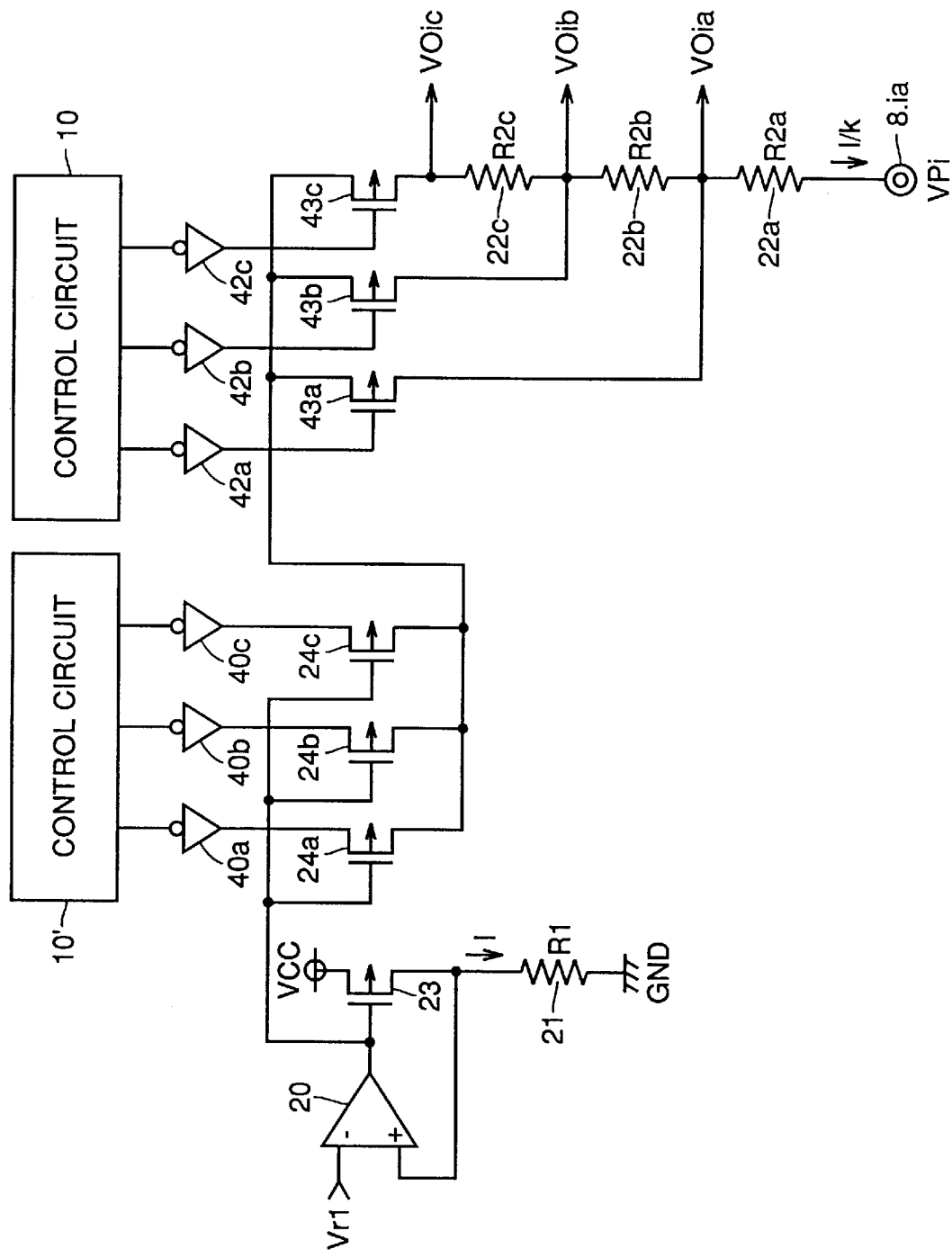
FIG. 20 is a circuit block diagram showing main components of a negative high voltage detect circuit which is a modification of the high voltage detect circuit of FIG. 19.

Also, as shown in FIG. 20, the structure of the positive high voltage detect circuit of FIG. 19 can be applied to the detection of a negative high voltage. More specifically, in the negative high voltage detect circuit of FIG. 20, N channel MOS transistors 25 and 26a–26c and inverters 41a–41c of the positive high voltage detect circuit of FIG. 19 are substituted with P channel MOS transistors 43a–43c and inverters 42a–42c, respectively. P channel MOS transistors 24a–24c have their drains connected in common to the source of p channel MOS transistors 43a–43c. Inverters 42a–42c are connected between control circuit 10 and the gate of P channel MOS transistors 43a–43c. Resistance elements 22a–22c are connected in series between output terminal 8.ia and the drain of P channel MOS transistor 43a. The node between resistance elements 22a and 22b is connected to the drain of P channel MOS transistor 43a. The node between resistance elements 22b and 22c is connected with the drain of P channel MOS transistor 43b.

The gate width of P channel MOS transistors 24a–24c become sequentially greater. The gate width of P channel MOS transistor 43a–43c is identical. By selecting any one of inverters 40a–40c and driving the input node of the selected inverter to an L level, the current I/k flowing through resistance elements 22a–22c can be selected. Also, by selecting any one of inverters 42a–42c and driving the input node of that selected inverter to an L level, the resistance element through which current I/k flows can be selected. Accordingly, output voltage VPi can be adjusted in a plurality of stages.

Sixth Embodiment

For example, in the high voltage detect circuit of FIG. 16, when the output node of inverter 40c attains an H level and the output nodes of inverters 40a and 40b attain an L level, there is a possibility that current flows from the output node of inverter 40c to the output node of inverter 40b via P channel MOS transistor 24c, resistance element 22c and P channel MOS transistor 24b. In practice, VCC is 3V and the gate potential of P channel MOS transistors 24a–24c is approximately 2V, so that such a current is low because the P channel MOS transistor with a source of 0V (in this case, transistors 24a, 24b) attains a high resistance state. In the present embodiment, such a current is further reduced.

Figure 21:
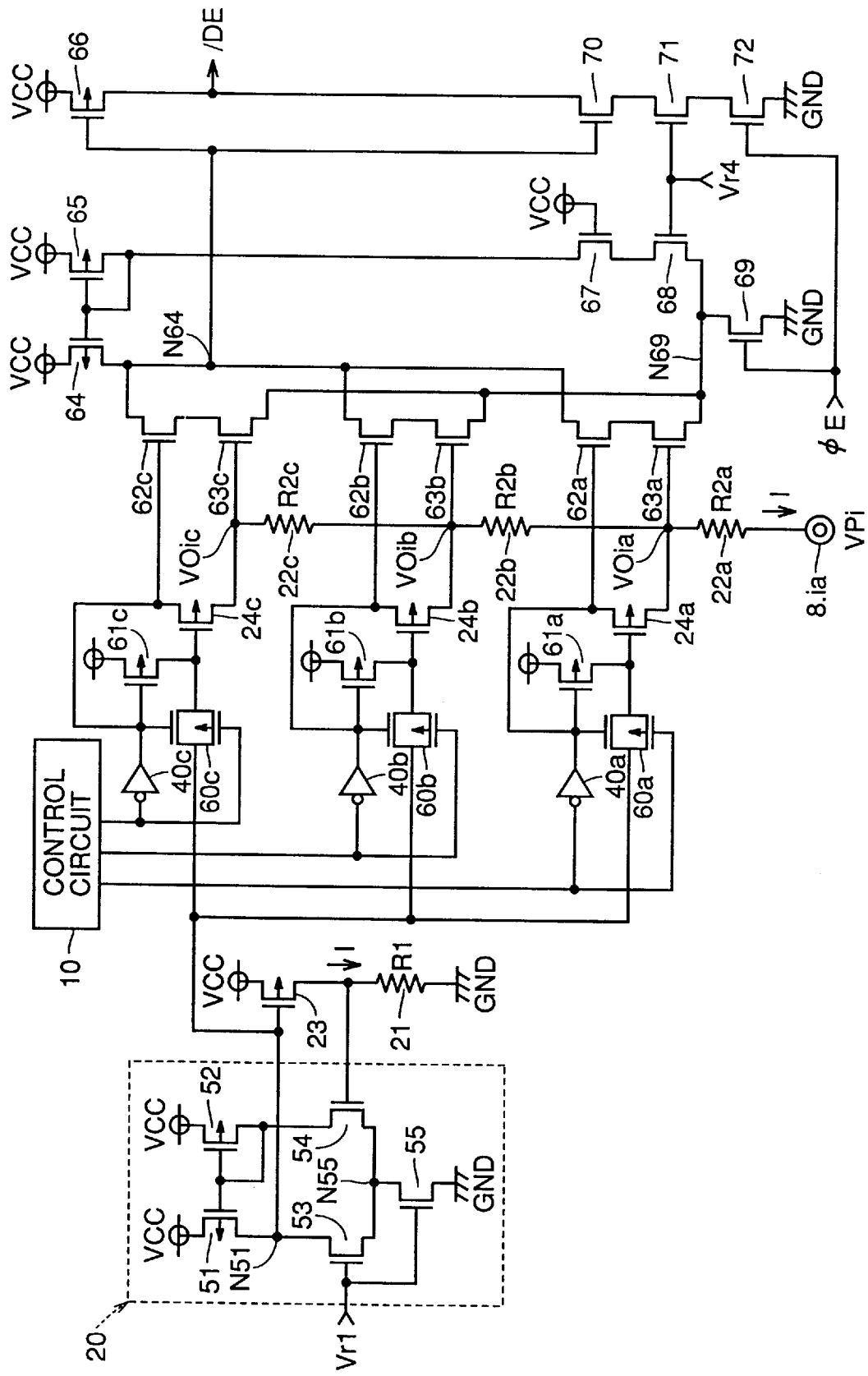
FIG. 21 is a circuit block diagram showing a structure of a negative high voltage detect circuit according to a sixth embodiment of the present invention.

FIG. 21 is a circuit block diagram showing a structure of a negative high voltage detect circuit according to the sixth embodiment of the present invention, and corresponds to FIG. 16.

Referring to FIG. 21, operational amplifier 20 includes P channel MOS transistors 51 and 52, and N channel MOS transistors 53–55. MOS transistors 51 and 53 and MOS transistors 52 and 54 are connected in series between the power supply potential line and node N55. N channel MOS transistor 55 is connected between node N55 and the ground potential line. P channel MOS transistors 51 and 52 have their gates connected to the drain of P channel MOS transistor 52. P channel MOS transistors 51 and 52 form a current mirror circuit. N channel MOS transistors 53 and 55 receive reference potential Vr1 at their gates. N channel MOS transistor 54 has its gate connected to the drain of P channel MOS transistor 23. P channel MOS transistor 51 has its drain (node N51) connected to the gate of P channel MOS transistor 23.

When current I increases so that the gate potential of N channel MOS transistor 54 becomes higher than reference potential Vr1, the resistance value of P channel MOS transistor 23 increases to cause reduction in current I. In contrast, when current I is reduced so that the potential of N channel MOS transistor 54 becomes lower than reference potential Vr1, the potential of node N51 becomes lower. The resistance value of P channel MOS transistor 23 is reduced to increase current I. Therefore, the gate of N channel MOS transistor 54 is maintained at reference potential R1.

Transfer gates 60a–60c are connected between the gate of P channel MOS transistors 23 and the gates of P channel MOS transistors 24a–24c. The gates at the N channel MOS transistor side out of transfer gates 60a–60c are connected to the output nodes of inverters 40a–40c, whereas the gates of the P channel MOS transistor side out of transfer gates 60a–60c are connected to the input nodes of inverters 40a–40c. P channel MOS transistors 61a–61c are connected between the power supply potential line and the gates of P channel MOS transistors 24a–24c. P channel MOS transistors 61a–61c receive the outputs of inverters 40a–40c at their gates.

P channel MOS transistor 64 and N channel MOS transistors 62a and 63a are connected between the power supply potential line and a node N69. N channel MOS transistors 62b and 63b are connected between the drain of P channel MOS transistor 64 and node N69. N channel MOS transistors 62c and 63c are connected between the drain of P channel MOS transistor 64 and node N69. P channel MOS transistors 62a–62c receive the outputs of inverters 40a–40c, respectively, at their gates. P channel MOS transistors 63a–63c receive VOia–VOic, respectively, at their gates.

P channel MOS transistor 65 and N channel MOS transistors 67 and 68 are connected between the power supply potential line and node N69. P channel MOS transistors 64 and 65 have their gates connected to the drain of P channel MOS transistor 65. P channel MOS transistors 64 and 65 form a current mirror circuit. P channel MOS transistor 67 receives power supply potential VCC at its gate. P channel MOS transistor 68 receives reference potential Vr4 at its gate. N channel MOS transistor 69 is connected between node N69 and the ground potential line. N channel MOS transistor 69 receives activation signal φE at its gate. A selected one set of N channel MOS transistors (for example transistors 62c and 63c) out of N channel MOS transistors 62a, 63a; 62b, 63b; 62c, 63c, and P channel MOS transistors 64, 65, and N channel MOS transistors 67–69 form a comparator (differential amplifier). The drain (node N64) of P channel MOS transistor 64 serves as the output node of the comparator.

P channel MOS transistor 66 and N channel MOS transistors 70–72 are connected in series between the lines of power supply potential VCC and ground potential GND. P channel MOS transistor 66 and N channel MOS transistor 70 have their gates connected to the output node of the comparator. P channel MOS transistor 66 and N channel MOS transistor 70 form an inverter. This inverter outputs signal /DE. N channel MOS transistor 71 receives reference potential Vr4 at its gate. N channel MOS transistor 72 receives activation signal φE at its gate.

The operation of this negative high voltage detect circuit will be described hereinafter. It is assumed that the input nodes of inverters 40a and 40b are driven to an H level and the input node of inverter 40c is driven to an L level by control circuit 10. Activation signal φE is driven to an H level. In this case, only transfer gate 60c out of transfer gates 60a–60c conducts, and P channel MOS transistors 61a and 61b out of P channel MOS transistors 61a–61c conduct.

Figure 22:
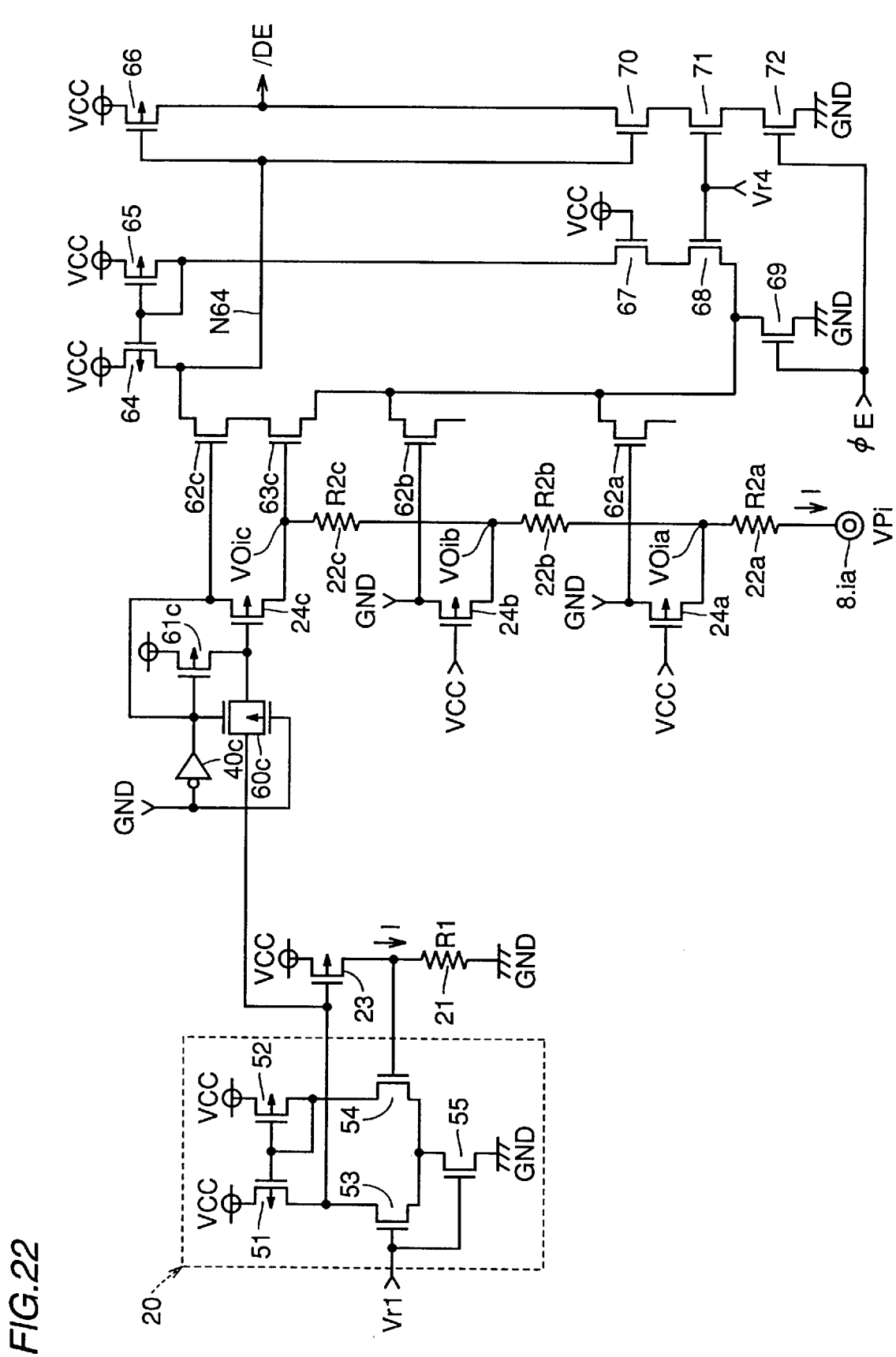
FIG. 22 is a circuit block diagram for describing an operation of the high voltage detect circuit of FIG. 21.
Figure 23:
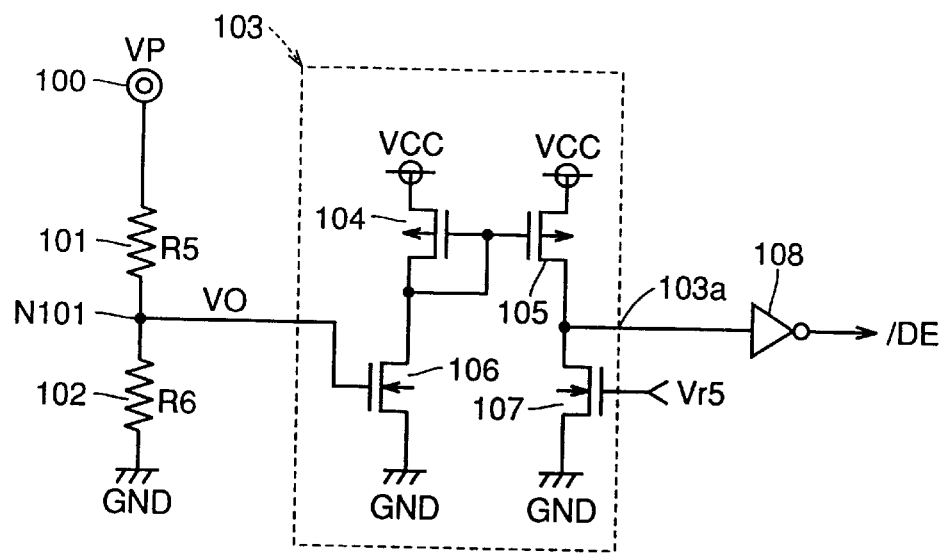
FIG. 23 is a circuit diagram showing a structure of a conventional high voltage detect circuit.
Figure 24:
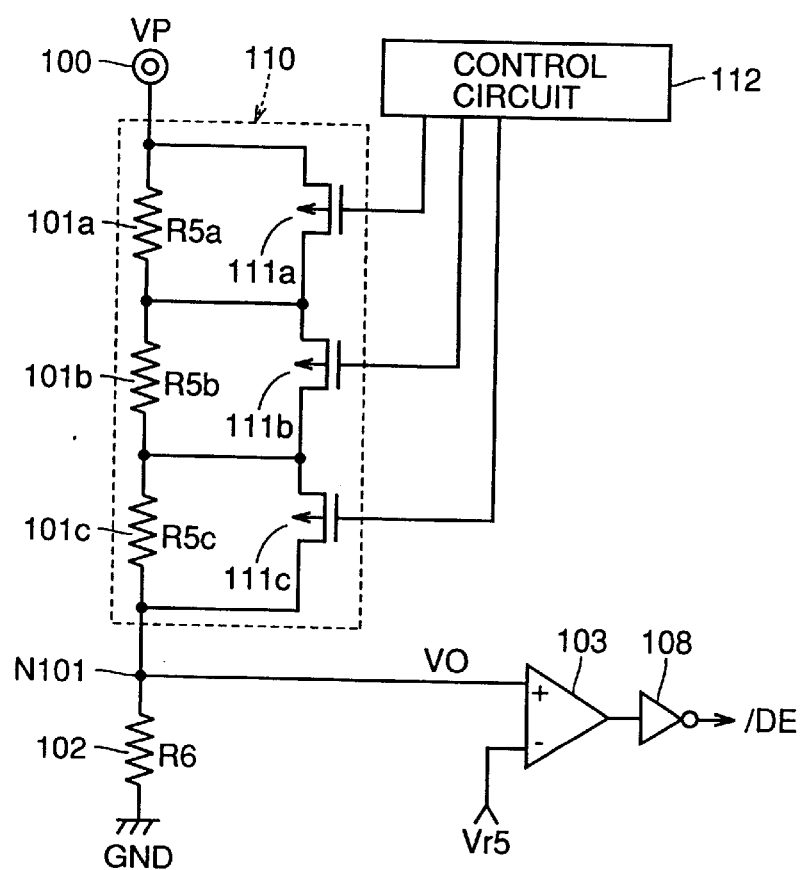
FIG. 24 is a circuit block diagram showing a structure of another conventional high voltage detect circuit.

Therefore, as shown in FIG. 22, only the gate of P channel MOS transistor 24c out of P channel MOS transistors 24a–24c is connected to the gate of P channel MOS transistor 23, whereby P channel MOS transistors 24a and 24b are rendered nonconductive. Therefore, no current will flow from the output node of inverter 40c to the output node of inverter 40b through P channel MOS transistor 24c, resistance element 22c and P channel MOS transistor 24b.

Also, only N channel MOS transistor 62c among N channel MOS transistors 62a–62c conducts. A comparator is implemented by MOS transistors 62c, 63c, 64, 65, 67–69. When VOic becomes lower than Vr4, output node N64 of the comparator attains an H level. As a result, output signal /DE of the inverter formed of MOS transistors 66 and 70 attain an L level. Thus, charge pump circuit 31 of FIG. 8 is rendered inactive.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A potential detect circuit for detecting whether a potential of an output node of a potential generation circuit has arrived at a predetermined target potential, said potential detect circuit comprising:

a first resistance element having one electrode connected to said output node, and having a predetermined first resistance value;

a constant current circuit connected between another electrode of said first resistance element and a line of a first reference potential for conducting a predetermined current to said first resistance element; and a comparator circuit comparing a second reference potential which is said target potential shifted in level towards said first reference potential side by a voltage obtained by multiplying said predetermined first resistance value by said predetermined current with a potential of the another electrode of said first resistance element to output a signal according to the comparison result.

2. The potential detect circuit according to claim 1, wherein said predetermined current of said constant current circuit is variable.

3. The potential detect circuit according to claim 1, wherein said constant current circuit comprises a first transistor having a first electrode connected to a line of a first power supply potential, a second resistance element connected between a second electrode of said first transistor and a line of a second power supply potential, and having a predetermined second resistance value, a control circuit controlling an input voltage of said first transistor so that a potential of the second electrode of said first transistor matches a predetermined third reference potential, and a second transistor connected between the another electrode of said first resistance element and the line of said first reference potential, and conducting a current according to the current flowing through said first transistor.

4. The potential detect circuit according to claim 3, wherein said predetermined second resistance value of said second resistance element is variable.

5. The potential detect circuit according to claim 3, wherein a current ratio of said first and second transistors is variable.

6. The potential detect circuit according to claim 1, wherein said predetermined first resistance value of said first resistance element is variable.

7. The potential detect circuit according to claim 3, wherein said first resistance element is divided into a plurality of third resistance elements connected in series, wherein said second transistor is provided corresponding to each third resistance element, and having a first electrode connected to an electrode of a corresponding third resistance element located at said constant current circuit side, said potential detect circuit further comprising:
a select circuit for selecting any of a plurality of said second transistors; and
a connection circuit for connecting a second electrode of the second transistor selected by said select circuit with the line of said first reference potential.

8. The potential detect circuit according to claim 7, further comprising a voltage apply circuit applying a predetermined input voltage to a second transistor not selected by said select circuit to render the non-selected second transistor nonconductive.

9. The potential detect circuit according to claim 1, wherein said potential generation circuit is a charge pump circuit.

10. The potential detect circuit according to claim 1, wherein said potential generation circuit and said potential detect circuit are provided in a semiconductor memory device.

11. A potential detecting circuit comprising:

a first node receiving a first potential, said first potential being a target potential to be detected;

a resistance circuit connected between said first node and a second node, and having a predetermined constant resistance value;

a transistor connected between said second node and a third node to which a second potential is provided, said second potential being a predetermined constant potential;

a constant potential generation circuit driven by said second potential and a third potential different from said first potential and applying a predetermined constant potential as a first reference potential to a control electrode of said transistor; and a comparator circuit including a first input terminal connected to said second node and a second input terminal receiving a second reference potential, comparing potentials of said first and second input terminals to output a signal of a level according to the comparison result.

12. A potential detecting circuit comprising:

a level shift circuit generating and providing to a first node a potential lower than a potential provided to a second node by a predetermined voltage, said potential provided to the second node being a target potential to be detected, said level shift circuit comprising:

a first transistor of a first conductivity type having a first electrode connected to a line of a power supply potential;

a first resistance circuit connected between a second electrode of said first transistor and a line of a first reference potential, and having a predetermined first resistance value;

a control circuit controlling an input voltage of said first transistor so that a potential of the second electrode of said first transistor attains a predetermined second reference potential;

a second transistor of the first conductivity type having a first electrode connected to the line of said power supply potential, and having an input electrode connected to an input electrode of said first transistor;

a third transistor of a second conductivity type having a first electrode and an input electrode connected to a second electrode of said second transistor, and having a second electrode connected to the line of said first reference potential;

a fourth transistor of the second conductivity type connected between said first node and the line of said first reference potential, and having an input electrode connected to an input electrode of said third transistor; and a second resistance circuit connected between said first and second nodes, and having a predetermined second resistance value; and a comparator circuit including a first input terminal connected to said first node and a second input terminal receiving a second reference potential, comparing potentials of said first and second input terminals to output a signal of a level according to the comparison result.

13. The potential detect circuit according to claim 11, wherein said second potential is a ground potential.

14. The potential detect circuit according to claim 11, wherein said second potential is a power supply potential.

* * * * *